United States Patent
Cirillo et al.

(10) Patent No.: US 7,136,010 B2
(45) Date of Patent: *Nov. 14, 2006

(54) MEASUREMENT AND SIGNATURE INTELLIGENCE ANALYSIS AND REDUCTION TECHNIQUE

(75) Inventors: Francis Robert Cirillo, Melbourne, FL (US); Paul Leonard Poehler, Melbourne, FL (US)

(73) Assignee: Science Applications International Corporation, San Diego, CA (US)

( * ) Notice: Subject to any disclaimer, the term of this patent is extended or adjusted under 35 U.S.C. 154(b) by 284 days.

This patent is subject to a terminal disclaimer.

(21) Appl. No.: 10/776,310

(22) Filed: Feb. 11, 2004

(65) Prior Publication Data

US 2004/0160353 A1 Aug. 19, 2004

Related U.S. Application Data

(63) Continuation-in-part of application No. 10/269,818, filed on Oct. 11, 2002, now Pat. No. 6,714,154.

(60) Provisional application No. 60/392,316, filed on Jun. 28, 2002.

(51) Int. Cl.
*G01S 13/90* (2006.01)

(52) U.S. Cl. .............. 342/25 R; 342/25 D; 342/25 F; 342/192; 342/194; 342/196

(58) Field of Classification Search .............. 342/25 R, 342/25 D, 25 F, 192, 194, 195, 196; 341/50, 341/51

See application file for complete search history.

(56) References Cited

U.S. PATENT DOCUMENTS

| | | | |
|---|---|---|---|
| 4,801,939 A | 1/1989 | Jones | |
| 5,535,013 A | 7/1996 | Murata | |
| 5,546,085 A | 8/1996 | Garnaat et al. | |
| 5,661,477 A | 8/1997 | Moreira et al. | |
| 6,005,982 A | 12/1999 | Abe | |
| 2004/0021600 A1 | 2/2004 | Wittenberg | |

FOREIGN PATENT DOCUMENTS

| | | | |
|---|---|---|---|
| EP | 0586225 A2 | | 3/1994 |
| GB | 2411087 A | * | 8/2005 |
| WO | WO2004/004309 | | 1/2004 |

OTHER PUBLICATIONS

NN84056410; Compression Technique for Text Character Streams; IBM Technical Disclosure Bulletin; May 1984; vol. 26, Issue 12, pp. 6410-6412.*

(Continued)

*Primary Examiner*—Dan Pihulic
(74) *Attorney, Agent, or Firm*—Banner & Witcoff, Ltd.

(57) ABSTRACT

Methods and apparatus compress data, comprising an In-phase (I) component and a Quadrature (Q) component. Statistical characteristics of the data are utilized to convert the data into a form that requires fewer bits in accordance with the statistical characteristics. The data may be further compressed by transforming the data and by modifying the transformed data in accordance with a quantization conversion table that is associated with the processed data. Additionally, redundancy may be removed from the processed data with an encoder. Subsequent processing of the compressed data may decompress the compressed data in order to approximate the original data by reversing the process for compressing the data with corresponding inverse operations. Interleaved I and Q components can be processed rather than separating the components before processing the data. The processed data type may be determined by providing metadata to retrieve the appropriate quantization table from a knowledge database.

29 Claims, 19 Drawing Sheets

OTHER PUBLICATIONS

S. A. Kuschel, B. Howlett, S. Wei and S. Werness, "*ASARS-2 Complex Image Compression Studies Final Report*", ERIM, Mar. 1997.

G. Poggi, A. R. P. Ragozini, and L. Verdoliva, "*Compression of SAR Data Through Range Focusing. and Variable-Rate Vector Quantization*", IEEE Transactions on Geoscience and Remote Sensing, vol. 38, pp. 1282-1289, May 2000.

I. H. McLeod, I. G. Cumming, and M. S. Seymour, "*ENVISAT ASAR Data Reduction: Impact on SAR Interferometry*", IEEE Transactions on Geoscience and Remote Sensing, vol. 36, pp. 589-602, Mar. 1998.

U. Benz, K. Strodl, and A. Moreira, "*A Comparison of Several Algorithms for SAR Raw Data Compression*", IEEE Transactions on Geoscience and Remote Sensing, vol. 33, pp. 1266-1276, Sep. 1995.

J. Fischer, U. Benz, A. Moriera, "*Efficient SAR Raw Data Compression in Frequency Domain*", IGARSS'99: IEEE International Geoscience and Remote Sensing Symposium Proceedings, vol. 4, pp. 2261-2263, Jun. 28-Jul. 2, 1999.

P. Eichel and R. W. Ives, "*Compression of Complex-Valued SAR Images*", IEEE Transactions on Image Processing, vol. 8, pp. 1483-1487, Oct. 1999.

S. Peskova and S. Vnotchenko, "*Analysis of Complex SAR Raw Data Compression*", CEOS 1999.

R. Kwok and W. T. K. Johnson, "*Block Adaptive Quantization of Magellan SAR Data*", IEEE Transactions on Geoscience and Remote Sensing, vol. 27, pp. 375-383, Jul. 1989.

G. Schirinzi, "*SAR Raw Data Compression Techniques*", CEOS, Oct. 1999.

A. V. Oppenheim and J. S. Lim, "*The Importance of Phase in Signal*", Proceeding of the IEEE, vol. 29, pp. 529-541, 1981.

Randal C. Reininger and Jerry D. Gibson, "*Distributions of the Two-Dimensional DCT Coefficients for Images*", IEEE Transactions on Communications, vol. COM-31, No. 6, pp. 835-839, Jun. 1983.

Julia Minguillon and Jaume Pujol, "*JPEG Standard Uniform Quantization Error Modeling with Applications to Sequential and Progressive Operation Modes*", Journal of Electronic Imaging, vol. 10, No. 2, pp. 475-485, Apr. 2001.

Gregory K. Wallace, "*The JPEG Still Picture Compression Standard*", IEEE Transactions on Consumer Electronics, Dec. 1991.

G. Mercier, J. Mvogo, M. Mouchot, G. Cazuguel, and J. Rudant, "*Compression of Temporal Series of Registered SAR Images*", CEOS, 1999.

Bing Zeng and Anastatios Venetsanopoulous, "*A JPEG-Based Interpolative Image Coding Scheme*", IEEE Publication 0-7803-0946-4/93, 1993.

James W. Owens and Michael W. Marcillin, "*Rate Allocation for Spotlight SAR Phase History Data Compression*", IEEE Transactions on Image Processing, vol. 8, No. 11, pp. 1527-1533, Nov. 1999.

Norman B. Nill, "*A Visual Model Weighted Cosine Transform for Image Compression and Quality Assessment*", IEEE Transactions on Communications, vol. COM-33, No. 6, pp. 551-557, Jun. 1985.

Andreas E. Savakis, "*Evaluation of Algorithms for Lossless Compression of Continuous-Tone Images*", Journal of Electronic Imaging, vol. 11, No. 1, pp. 75-86, Jan. 2002.

Dorian Kermish, "*Image Reconstruction from Phase Information Only*", Journal of the Optical Society of America, vol. 60, No. 1, pp. 15-17, Jan. 1970.

John A. Saghri, Andrew G. Tescher, and John T. Reagan, "*Spaced-Based Data Compression Issues*", Journal of Electronic Imaging, vol. 3, No. 8, pp. 301-310, Jul. 1999.

N. Beaucoudrey, T. Seren, D. Barba, and X. Morin, "*Data Compression for Transmission of Polarimetric SAR Signal by Vector Quantization—Performance Evaluation*", CEOS, 1999.

Hans Marmolin, "*Subjective MSE Measures*", IEEE Transactions on Systems, Man, and Cybernetics, vol. SMC-16, No. 3, May/Jun. 1986.

\* cited by examiner

MEASUREMENT AND SIGNATURE INTELLIGENCE ANALYSIS AND REDUCTION TECHNIQUE

This application is a continuation-in-part of common-owned application Ser. No. 10/269,818, U.S. Pat. No. 6,714,154, issued Mar. 30, 2004, naming Francis Robert Cirillo and Paul Leonard Poehler as inventors and claiming priority to provisional U.S. Application No. 60/392,316 ("Measurement and Signature Intelligence Analysis and Reduction Technique"), filed Jun. 28, 2002.

FIELD OF THE INVENTION

The present invention relates to compressing and decompressing data such as synthetic aperture radar data.

BACKGROUND OF THE INVENTION

Compression of Synthetic Aperture Radar (SAR) data may require that both magnitude and phase information be preserved. FIG. 1 shows data processing of synthetic aperture radar data according to prior art. Synthetic aperture radar data 102 are typically collected in analog-format by an antenna 101 and is converted to digital format through an Analog-to-Digital (A/D) converter 103. The raw, unprocessed data are referred to as Video Phase History (VPH) data 104, and comprise two components: In-phase (I) and Quadrature (Q). Video phase history data 104 having multiple components, such as I and Q, are typically referred as complex SAR data. Complex SAR data are essential for the generation of complex SAR applications products such as interferograms, polarimetry, and coherent change detection, in which a plurality of such images must be processed and compared.

Video phase history data 104 are then passed through a Phase History Processor (PHP) 105 where data 104 are focused in both range (corresponding to a range focusing apparatus 107) and azimuth (corresponding to an azimuth focusing apparatus 109). The output of phase history processor 105 is referred to as Single Look Complex (SLC) data 110. A detection function 111 processes SLC data 110 to form a detected image 112.

Existing complex SAR sensors collect increasingly large amounts of data. Processing the complex data information and generating resultant imagery products may utilize four to eight times the memory storage and bandwidth that is required for the detected data (I&Q). In fact, some studies suggest exponential growth in associated data throughput over the next decade. However, sensors are typically associated with on-board processors that have limited processing and storage capabilities. Moreover, collected data are often transmitted to ground stations over a radio channel having a limited frequency bandwidth. Consequently, collected data may require compression in order to store or transmit collected data within resource capabilities of data collecting apparatus. Also, a SAR compression algorithm should be robust enough to compress both VPH data 104 and SLC SAR data 110, should produce visually near-lossless magnitude image, and should cause minimal degradation in resultant products 112.

Several compression algorithms have been proposed to compress SAR data. However, while such compression algorithms generally work quite well for magnitude imagery, the compression algorithms may not efficiently compress phase information. Moreover, the phase component may be more important in carrying information about a SAR signal than the magnitude component. With SAR data 102, compression algorithms typically do not achieve compression ratios of more than ten to one without significant degradation of the phase information. Because many of the compression algorithms are typically designed for Electro/Optical (EO) imagery, the compression algorithms rely on high local data correlation to achieve good compression results and typically discard phase data prior to compression. Table 1 lists several compression algorithms discussed in the literature and provide a brief description of each.

TABLE 1

Popular Alternative SAR Data Compression Algorithms

| Compression Algorithm | Description |
| --- | --- |
| Block Adaptive Quantization (BAQ) | Choice of onboard data compression methods due to simplicity in coding and decoding hardware. Low compression ratios achieved (<4:1). |
| Vector Quantization (VQ) | Codebook created assigning a number for a sequence of pixels. Awkward implementation since considerable complexity required in codebook formulation. |
| Block Adaptive Vector Quantization (BAVQ) | Consists of first compressing data with BAQ and then following up with VQ. Similar to BAQ. |
| Karhunen-Loeve Transform (KLT) | Statistically optimal transform for providing uncorrelated coefficients; however, computational cost is large. |
| Fast Fourier Transform BAQ (FFT-BAQ) | 2-D Fast Fourier Transform (FFT) performed on raw SAR data. Before raw data is transformed, dynamic range for each block is decreased using a BAQ. |
| Uniform Sampled Quantization (USQ) | Emphasizes phase accuracy of selected points. |
| Flexible BAQ (FBAQ) | Based on minimizing mean square error between original and reconstructed data. |
| Trellis-Coded Quantization (TCQ) | Unique quantizer optimization design. Techniques provide superior signal to noise ratio (SNR) performance to BAQ and VQ for SAR. |
| Block Adaptive Scalar Quantization (BSAQ) | BSAQ's adaptive technique provides some performance improvement. |

Existing optical algorithms are inadequate for compressing complex multi-dimensional data, such as SAR data compression. For example with optical imagery, because of a human eyesight's natural high frequency roll-off, the high frequencies play a less important role than low frequencies. Also, optical imagery has high local correlation and the magnitude component is typically more important than the phase component. However, such characteristics may not be applicable to complex multi-dimensional data. Consequently, a method and apparatus that provides a large degree of compression without a significant degradation of the processed signal are beneficial in advancing the art in storing and transmitting complex multi-dimensional data. Furthermore, the quality of the processed complex multi-dimensional data is not typically visually assessable. Thus, a means for evaluating the effects of compression on the resulting processed signal is beneficial to adjusting and to evaluating the compression process.

BRIEF SUMMARY OF THE INVENTION

The present invention provides methods and apparatus for compressing data comprising an In-phase (I) component and a Quadrature (Q) component. The compressed data may be saved into a memory or may be transmitted to a remote location for subsequent processing or storage. Statistical characteristics of the data are utilized to convert the data into a form that requires a reduced number of bits in accordance with its statistical characteristics. The data may be further compressed by transforming the data, as with a discrete cosine transform, and by modifying the transformed data in accordance with a quantization conversion table that is selected using a data type associated with the data. Additionally, a degree of redundancy may be removed from the processed data with an encoder. Subsequent processing of the compressed data may decompress the compressed data in order to approximate the original data by reversing the process for compressing the data with corresponding inverse operations.

In a first embodiment of the invention, data are compressed with an apparatus comprising a preprocessor, a transform module, a quantizer, an encoder, and a postprocessor. The preprocessor separates the data into an I component and a Q component and bins each component according to statistical characteristics of the data. The transform module transforms the processed data into a discrete cosine transform that is quantized by the quantizer using a selected quantization conversion table. The encoder partially removes redundancy from the output of the quantizer using Huffman coding. The resulting data can be formatted by a post-processor for storage or transmittal. With a second embodiment, the preprocessor converts the I and Q components into amplitude and phase components and forms converted I and Q components.

Variations of the embodiment may use a subset of the apparatus modules of the first or the second embodiment. In a variation of the embodiment, the apparatus comprises a preprocessor, a transform module, and a quantizer.

With another embodiment of the invention, interleaved I and Q components of SAR data can be processed rather than separating the components before processing the data. Thus, one is not constrained to separately compress and decompress the I and Q data. With the processing of interleaved I and Q data, one may assume that the statistical characteristics are the same, in which a deviation from this assumption may result in a reduced compression ratio. Moreover, the processing of interleaved data is applicable to data that are characterized by one or more dimensions.

With another embodiment of the invention, the data type being processed for compression and decompression is determined. With the compression process, the preprocessor interacts with the quantizer. The preprocessor provides metadata to the quantizer so that the quantizer can retrieve the appropriate quantization table from a knowledge database. The metadata may include statistical characteristics of the data being processed such as the mean, the standard deviation, and the maximum/minimum values. This aspect of the invention also supports a training mode, in which the quantizer informs the preprocessor so that a new data type can be specified.

BRIEF DESCRIPTION OF THE DRAWINGS

A more complete understanding of the present invention and the advantages thereof may be acquired by referring to the following description in consideration of the accompanying drawings, in which like reference numbers indicate like features and wherein.

DETAILED DESCRIPTION OF THE INVENTION

First-Generation Embodiments

In the following description of the various embodiments, reference is made to the accompanying drawings which form a part hereof, and in which is shown by way of illustration various embodiments in which the invention may be practiced. It is to be understood that other embodiments may be utilized and structural and functional modifications may be made without departing from the scope of the present invention.

Figure 1:
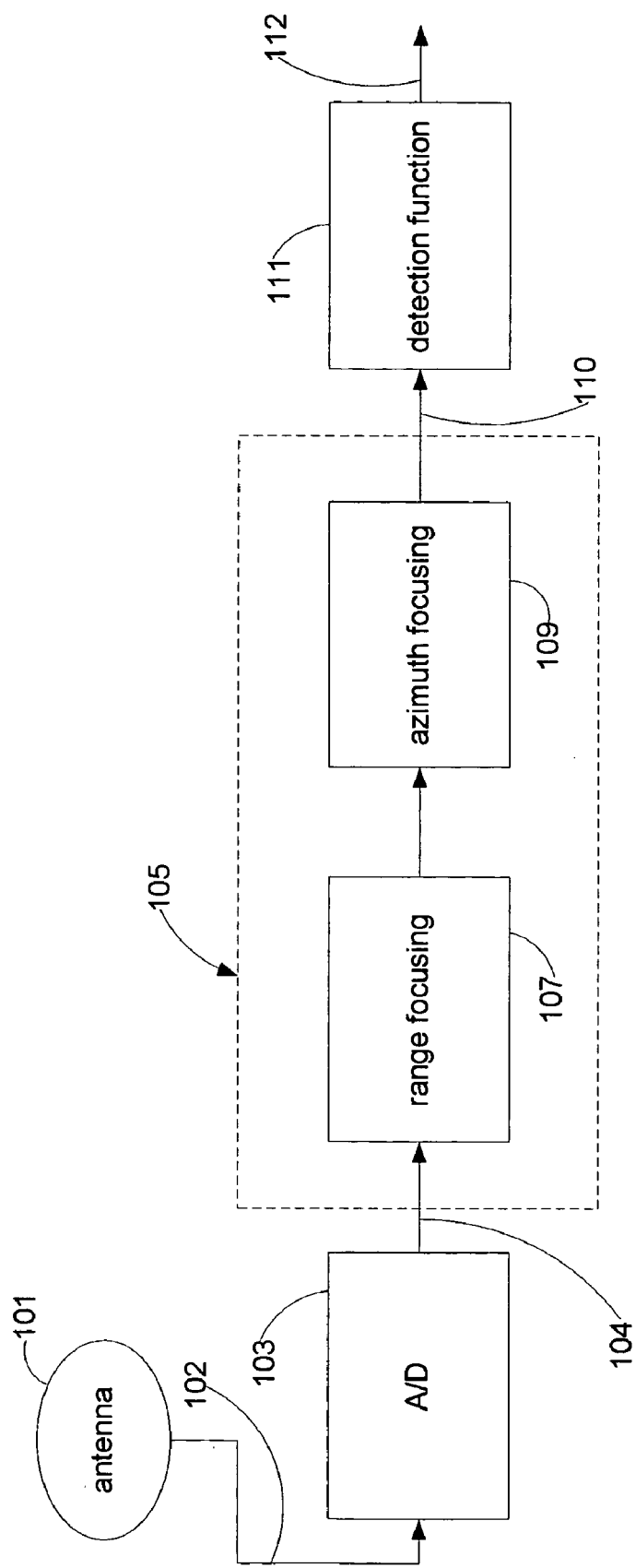
FIG. 1 shows data processing of synthetic aperture radar data according to prior art.
Figure 2:
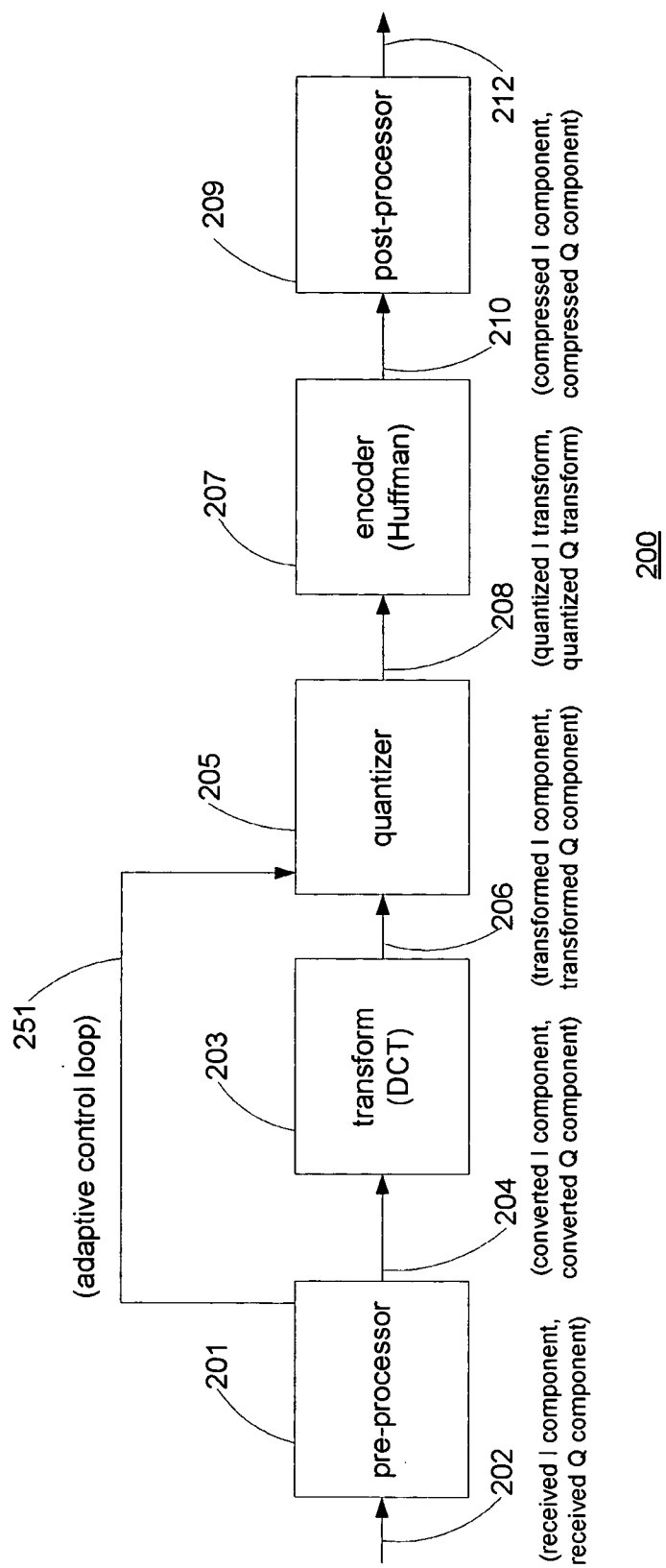
FIG. 2 shows an apparatus for compressing data in accordance with an embodiment of the invention.

FIG. 2 shows an apparatus 200 for compressing Synthetic Aperture Radar (SAR) data 202 in accordance with an embodiment of the invention. Synthetic Aperture Radar (SAR) data 202 can be compressed by apparatus 200 from Video Phase History (VPH) data format 104 or from a processed version typically referred as a single look complex SLC format 110. There are advantages and disadvantages associated with each format. VPH data 104 is available almost immediately, but is highly uncorrelated. Single look complex SLC data 110 exhibits some local correlation. SLC data 110 may yield slightly better compression results than with VPH data 104, but SLC 110 data are only available after processing has occurred.

Other embodiments of the invention may support other applications of complex multidimensional data, including weather data, oil and gas exploration data, encrypted/decrypted data, medical archival of MRI/CTI and three dimensional sonograms, digital video signals, and modem applications.

Referring again to FIG. 2, apparatus 200 comprises a preprocessor 201, a transform module 203, a quantizer 205, an encoder 207, and a post-processor 209 in order to provide compressed data 212. SAR data 202 may comprise SAR pixel data that may be provided in the form of two floating-point numbers representing In-phase (I) and Quadrature (Q) components. (SAR data 202 may be considered as being "received" even though the data may not be received from a radio receiver but obtained from a memory that stores the data.) Preprocessor 201 may convert the I and Q components to Magnitude (M) and Phase (φ) components in accordance with a second embodiment as will be discussed in the context of FIG. 4B. Additionally, preprocessor 201 may convert the I and Q components into magnitude and phase components to facilitate viewing SAR data 202. The magnitude and the phase components may be obtained from the in-phase and quadrature components by using Equations 1 and 2.

$$M = (I^2 + Q^2)^{1/2} \quad \text{(EQ. 1)}$$

$$\phi = \tan^{-1}(Q/I) \quad \text{(EQ. 2)}$$

Moreover, I and Q components may be obtained from the magnitude and the phase components by using Equations 3 and 4.

$$I = M \cos \phi \quad \text{(EQ. 3)}$$

$$Q = M \sin \phi \quad \text{(EQ. 4)}$$

Additionally, the power of a SAR signal may provide good visual results when printing intensity (magnitude-only) imagery. The power of a SAR signal may be obtained from Equation 5.

$$P = 20 \log_{10} M^2 \quad \text{(EQ. 5)}$$

The conversion between (I, Q) and (M, φ) as expressed in EQs. 1–4 allows SAR data 202 to be studied in both data formats before and after compression. When SAR data 202 are represented as magnitude and phase components, additional bits may be allocated to the phase component versus the magnitude component to achieve the least degradation of the phase product, depending on characteristics of SAR data 202. In an embodiment, more bits (e.g. six bits) of the phase component and fewer bits (e.g. two bits) of the magnitude component are used to generate compressed I and Q components. Conversely, when SAR data 202 are represented by in-phase and quadrature components, apparatus 200 can process the in-phase component separately from the quadrature component for a single complex image.

Preprocessor 201 also determines a data type (as discussed in the context of FIG. 3) and informs quantizer 205 through an adaptive control loop 251.

Figure 3:
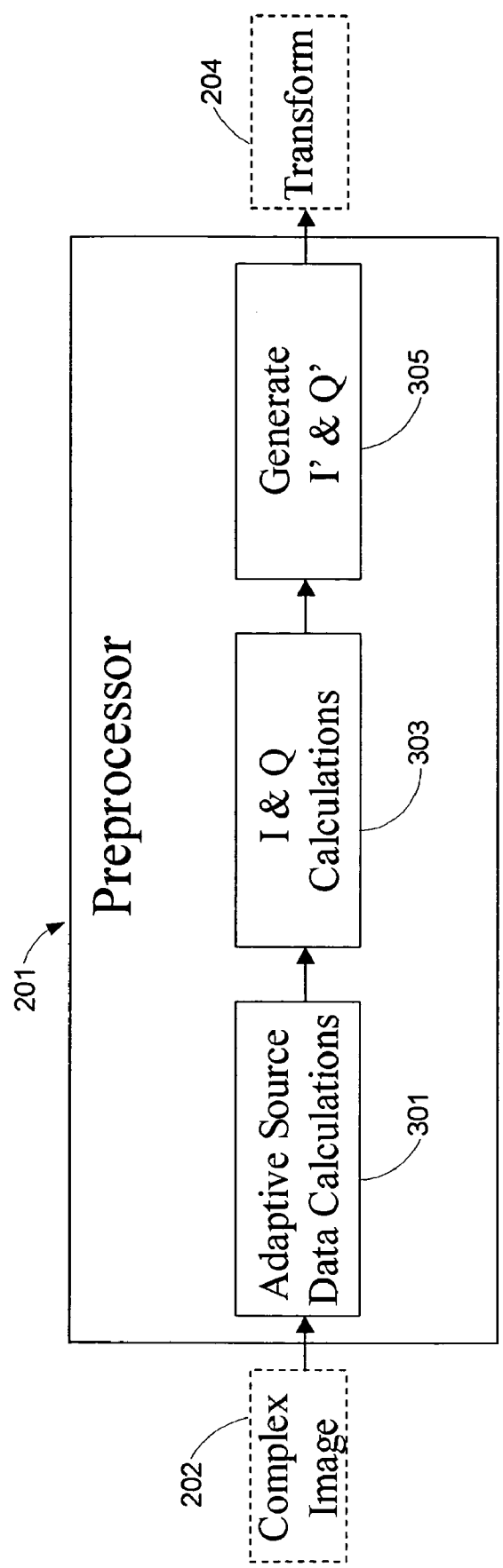
FIG. 3 shows a preprocessor apparatus for preprocessing a complex image in accordance with an embodiment of the invention.

FIG. 3 shows preprocessor apparatus 201 (as shown in FIG. 2) for preprocessing complex image 202 in accordance with an embodiment of the invention. Preprocessor apparatus 201 reduces the number of bits that are needed to represent complex data (I,Q) within a specified degradation (corresponding to an error metric). Typically, VPH data 104 or SLC 110 data are represented by (I,Q) data pairs 202, in which each pair uses 64, 32, or 16 bits, and where I and Q are separately represented in 32, 16, or 8-bit formats, respectively. Data 202 may be formatted in which an ordering of the most significant to the least significant bytes may be reversed with respect to the assumed order that preprocessor 201 processes data 202. In such a case, preprocessor 201 may perform "byte swapping" to reorder data 202 in accordance with the assumed ordering of the constituent bytes.

Figure 5:
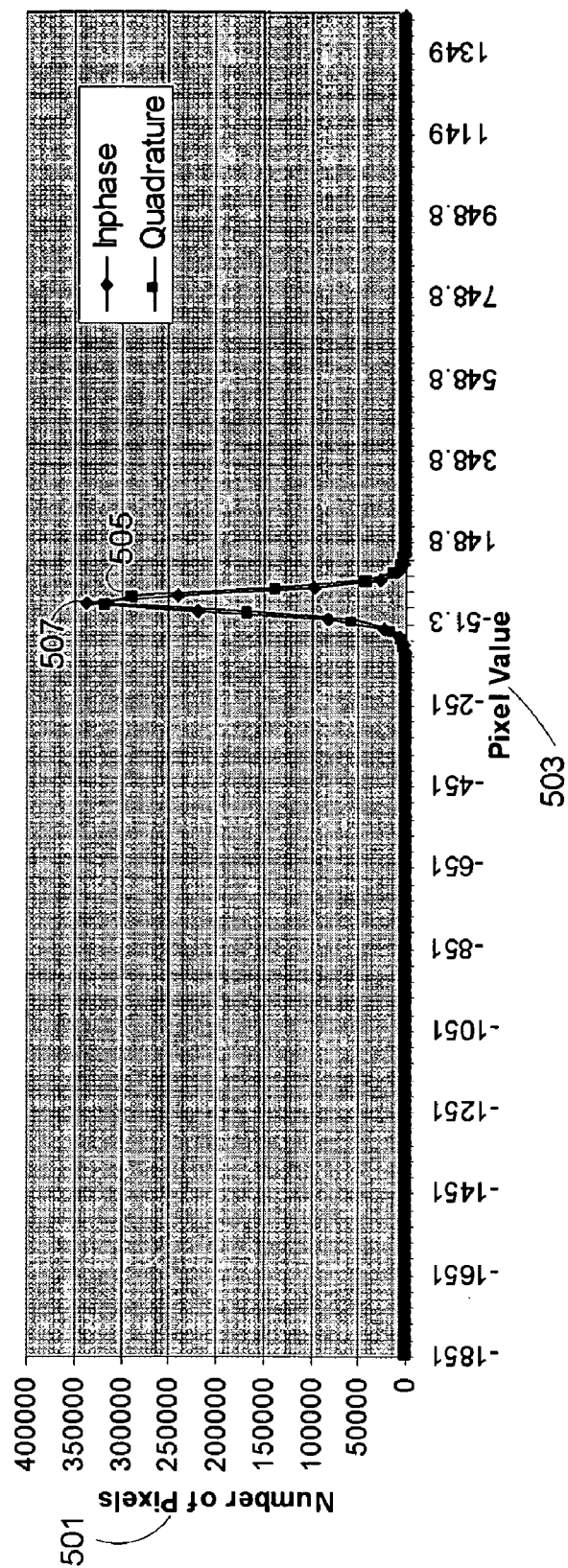
FIG. 5 shows probability density functions that are associated with In-phase (I) and Quadrature (Q) components of exemplary synthetic aperture radar (SAR) data.

An adaptive source data calculations module 301 separately processes the I and Q components of (I,Q) data pairs 202 in order to determine corresponding statistical characteristics. (An example of statistical characteristics is shown in FIG. 5, in which the I component has approximately the same statistical characteristics as the Q component.) In the embodiment, a general-purpose computer (e.g. an associated microprocessor) measures the number of occurrences of the I component or the Q component as a function of the value of the I component or the Q component. Additionally, adaptive source data calculations module 301 performs header analysis by reading information provided at the beginning of a data file comprising data 202 in order to determine the format of the data being analyzed, e.g. the number of bits that are associated with (I,Q) data 202. Module 301 also performs data analysis that provides statistical characteristics of data 202 as may be characterized by probability density functions of the I component and the Q component (as exemplified by FIG. 5). Module 301 determines a bin assignment that may vary with the value of the I or Q component. In the embodiment, a size of a bin is inversely related to a value of the probability density function at a midpoint of the bin. A calculations module 303 uses the statistical characteristics of data 202 to assign the I and Q components into bins. A module 305 uses the bin identity to form the I' and Q' components (converted I component and converted Q component, corresponding to data 204 in FIG. 2), having 8-bit integer values between 0 and 255 by efficiently allocating bins, in which most of the bins are assigned to a range containing the most data points. For example, data (corresponding to either I or Q) may range from −10,000 to +10,000 units, in which over 99.9% of the data are contained with a range of −2,000 to +2,000 units. In such a case, most of the bins would be allocated between the smaller range (i.e. −2000 to +2,000 units) rather than the larger range (i.e. −10,000 to +10,000 units).

In a variation of the embodiment, Single Look Complex (SLC) data 110 are transformed using a Fast Fourier Transform (FFT) prior to binning data 202 by modules 303 and 305, wherein a transformation of SLC data 110 has statistical characteristics that are similar to VPH data 104. (In the embodiment, modules 303 and 305 bin data 202 by first processing the I component and subsequently processing the Q component.) However, other embodiments of the invention may utilize other transform types in order to modify statistical characteristics of the data. After quantization by modules 303 and 305, the transformed SLC data are inversely transformed using an Inverse Fast Fourier Transform (IFFT).

Figure 4A:
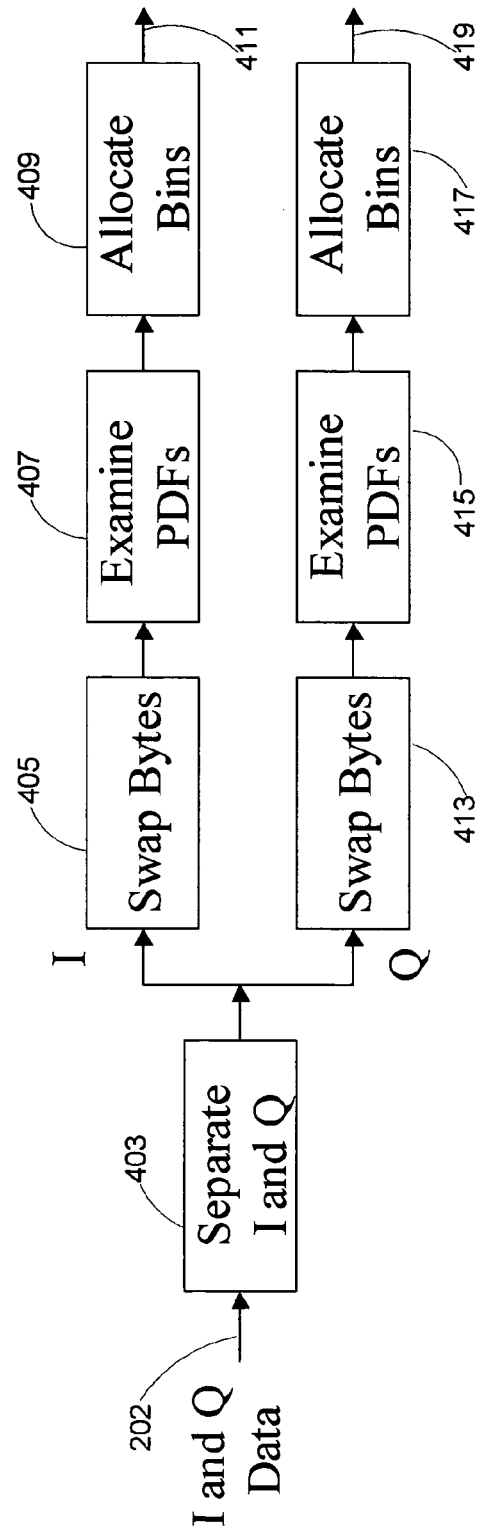
FIG. 4A shows a process for binning data associated with a complex image in accordance with an embodiment of the invention.

FIG. 4A shows a process for binning data associated with complex image data 202, as performed by module 303 in accordance with an embodiment of the invention. Complex image data 202 are separated into I and Q components by a module 403. If the most to the least significant bytes need to be reordered, modules 405 and 413 swap bytes for the I component and Q component, respectively. Modules 407 and 415 determine the probability density functions for the I component and the Q component, respectively over data files (comprising static images of a data gathering session). As discussed in the context of FIG. 5, the probability density functions of the I component and the Q component may be essentially the same so that embodiments of the invention may utilize one module by separately processing the I and Q components. Modules 409 and 417 bin the I component and the Q component, respectively. The greater the probability density function $p(x_i)$, where $x_i$ is the center value of the $i^{th}$ bin, the smaller the range of the $i^{th}$ bin in order to provide better resolution for data within the ith bin.

Figure 4B:
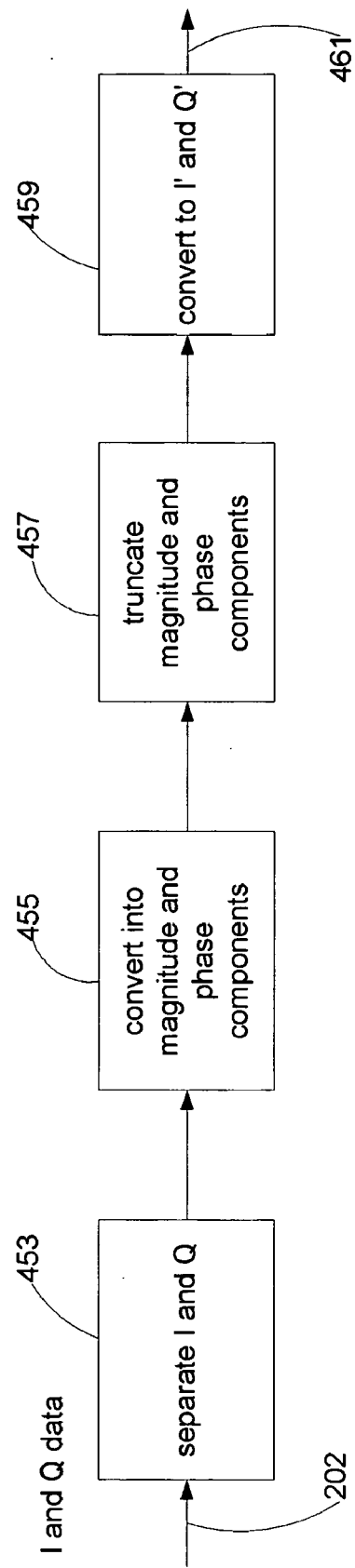
FIG. 4B shows a process for truncating magnitude and phase components of a complex image in accordance with an embodiment of the invention.

FIG. 4B shows a process for truncating magnitude and phase components of a complex image in accordance with a second embodiment of the invention. In a second embodiment of the invention, module 305 of preprocessor apparatus 201 may utilize a different number of bits that are associated with the phase component (φ) than is associated with the magnitude component (M). In the embodiment, fewer bits from the magnitude component (a truncation of M) and more bits from the phase component (a truncation of φ), as determined from Equations 1 and 2 by converting I and Q into M and φ, are used to generate compressed components I' and Q', as determined from Equations 3 and 4 by converting the truncations of M and φ into I' and Q'. Allocating more bits from the phase component helps preserve phase information, as may be the case with Video Phase History (VPH) data 104. As shown in FIG. 4B, complex image data 202 is separated into I and Q components by module 453. The I and Q components are converted into magnitude and phase components by module 455. Module 457 truncates the magnitude and phase components in order to retain a desired number of bits from each of the components. Module 459 converts the truncated portions of the magnitude and phase components to form compressed components I' and Q' (corresponding to data 461).

Apparatus 200 may use the same statistical modeling for the In-phase (I) and Quadrature (Q) components if both components have approximately the same statistical characteristics. FIG. 5 shows probability density functions that are associated with in-phase and quadrature components of exemplary synthetic aperture radar data. A number of pixels 501 is shown in relation to a corresponding pixel values 503 for a typical SAR image. A Probability Density Function (PDF) 507 for the in-phase component and a probability density function 505 for the quadrature component are approximately the same. FIG. 5 suggests that apparatus 200 may process both the in-phase component and the quadrature components in the same way without incurring a large error. If probability density function 507 is essentially the same as probability density function 505, then one may obtain a probability density of one of the components (either PDF 507 or PDF 505) and approximate the probability density function of the other component by the obtained probability density function. However, other embodiments of the invention may use different statistical relationships for the in-phase component and the quadrature component if the statistics characteristics differ appreciably.

Preprocessor 201 accommodates different sensor types regarding a data format and a number of bits per pixel. (A pixel corresponds to a point in the corresponding image being scanned by a radar system.) SAR data 202 are typically 64 bits (with 32 bits for the I component and 32 bits for the Q component for each pixel) or 32 bits (with 16 bits for the I component and 16 bits for the Q component for each pixel). Preprocessor 201 determines the range of pixel values and the best bin assignment. Values of the I and Q components are converted to 8-bit formats with more bits being allocated from the associated phase component than the magnitude component before reducing the I and Q components to 8-bit formats. (As previously discussed, two bits from the magnitude component and six bits from the phase component, as determined from Equations 1 and 2 by converting I and Q into M and φ, are used to generate compressed components I' and Q', as determined from Equations 3 and 4 by converting the truncations of M and φ into I' and Q'.)

Figure 6:
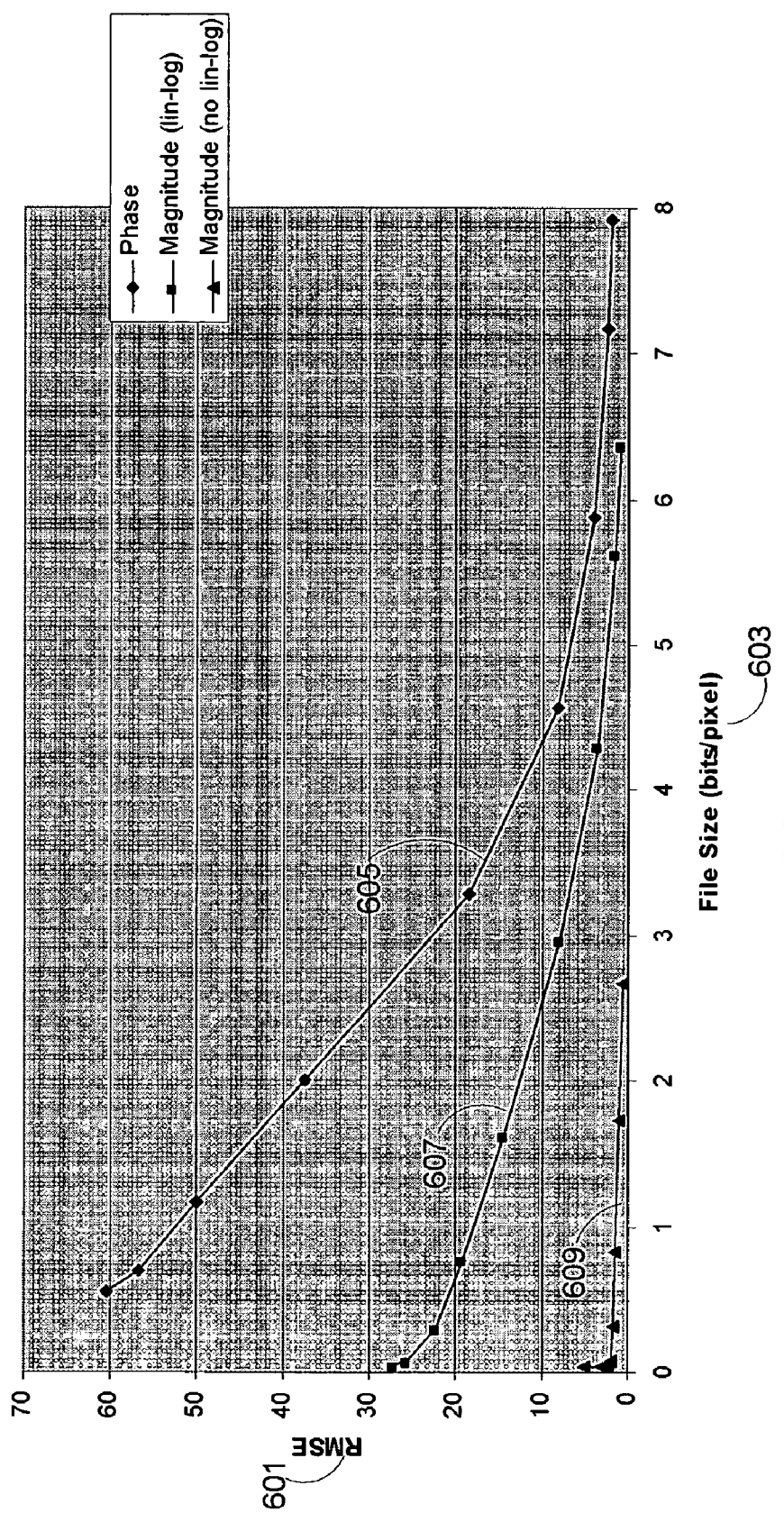
FIG. 6 shows Root Mean Square Error (RMSE) values that are associated with magnitude and phase data for processed signal data as shown in FIG. 2 in accordance with an embodiment of the invention.

FIG. 6 shows Root Mean Square Error (RMSE) values that are associated with magnitude and phase data for processed data (e.g. processed SAR data 204) as shown in FIG. 2 in accordance with an embodiment of the invention. (The root mean square error is a measure of the quantization error by relating the compressed data with the original data.) Values 601 are related to an assigned number of bits per pixel 603 for phase data 605, magnitude data 607 (with a linear-log representation), and magnitude data 609 (no linear-log representation). Similarly, calculations may be performed for (I, Q) data. Root mean square error and Peak Signal to Noise Ratio (PSNR) figures of merit may be initially used as a basis for designing preprocessor 201 and for the evaluating the compressed imagery.

Processed SAR data 204 (comprising a converted I component and a converted Q component) are further processed through transform module 203 using a Discrete Cosine Transform (DCT) in order to obtain the frequency representation of the in-phase and the quadrature data as transformed data 206 (comprising a transformed I component and a transformed Q component). As will be discussed in the context of FIG. 7, the converted I component and the converted Q component of SAR data 204 are separately partitioned into smaller blocks. (Each block is essentially independent of other blocks so that each block may be processed individually in order to process an entire image.) The discrete cosine transform is well known in the art, and is given by Equation 6.

$$B(k_1, k_2) = \qquad\qquad\qquad\qquad\qquad\text{(EQ. 6)}$$

$$\sum_{i=0}^{N_1-1}\sum_{j=0}^{N_2-1} 4 \cdot A(i,j) \cdot \cos\left[\frac{\pi \cdot k_1}{2 \cdot N_1} \cdot (2 \cdot i + 1)\right] \cdot \cos\left[\frac{\pi \cdot k_2}{2 \cdot N_2} \cdot (2 \cdot j + 1)\right]$$

In Equation 6, pair (i,j) represents a pixel of processed SAR data 204 within a block (which is a portion, A(i,j) represents a corresponding in-phase or quadrature value of the pixel, and B($k_1$,$k_2$) represents a corresponding DCT coefficient, where pair ($k_1$,$k_2$) identifies the DCT coefficient in the DCT matrix. In the embodiment, a DCT coefficient is calculated over an eight by eight pixel block, i.e. $N_1$ and $N_2$ equal 8, although other embodiments of the invention may use a different value for N. (The collection of DCT coefficients may be represented by an 8 by 8 matrix.)

Figure 7:
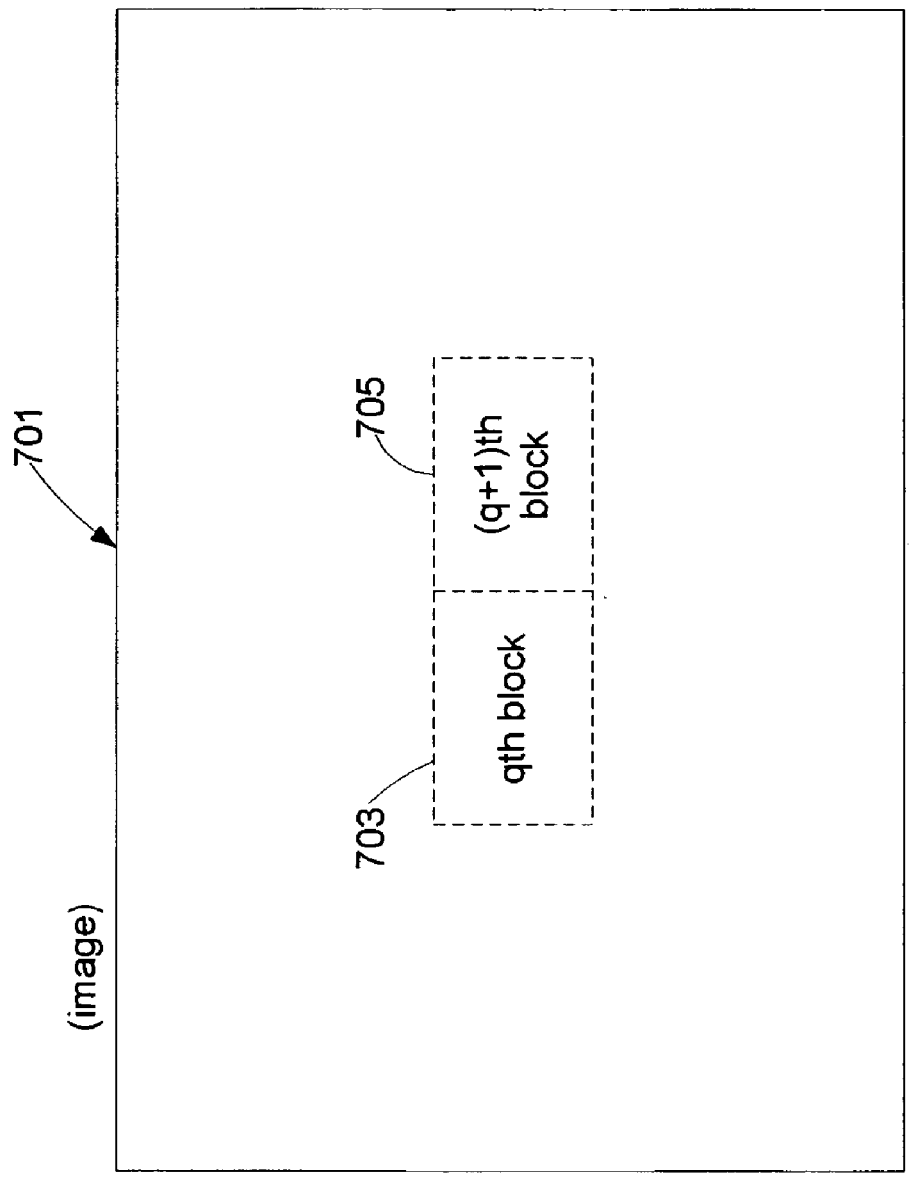
FIG. 7 shows a partitioning of complex image data in order to obtain Discrete Cosine Transform (DCT) in accordance with an embodiment of the invention.

FIG. 7 shows a partitioning of complex image data in order to obtain Discrete Cosine Transform (DCT) data in accordance with an embodiment of the invention. In the embodiment, SAR data 202 comprise the I component and the Q component, each component corresponding to a large (such as 1024 by 1024) data file 701. Transform module 203 partitions each file 701 into a square (such as a 8 by 8 block for the DCT matrix), e.g. blocks 703 and 705. Transform module 203 processes each block (e.g. 703 and 705) in accordance with Equation 6. In order to process the entire data file 701, preprocessor 201 processes 128 partitions for both the I component and the Q component.

Figure 8:
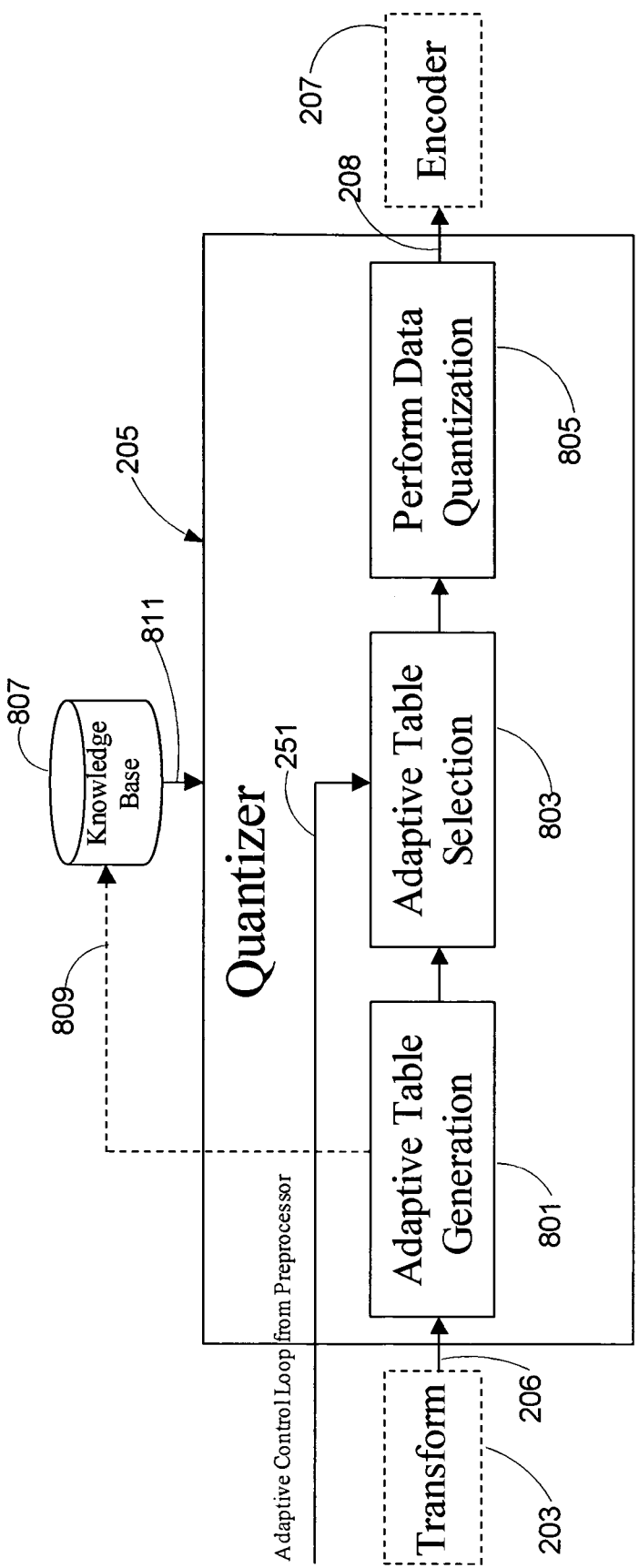
FIG. 8 shows an apparatus for quantizing Discrete Cosine Transform (DCT) data in accordance with an embodiment of the invention.

FIG. 8 shows apparatus 205 for quantizing Discrete Cosine Transform (DCT) data in accordance with an embodiment of the invention. Quantizer 205 comprises an adaptive table generation module 801, an adaptive table selection module 803, and a perform_data_quantization module 805. Adaptive table generation module 801 generates a new quantization conversion table (which contains a quantization matrix that is used for further data compression as will be explained) for a new data type and stores the new quantization conversion table into a knowledge database 807 through an interface 809 when functioning in a training mode but not during an operational mode. During the operational mode, transformed data 206 are processed by adaptive table selection module 803 and perform_data_quantization module 805. Depending upon the data type, as identified by adaptive control loop 251 from preprocessor 201, adaptive table selection module 803 selects an appropriate quantization conversion table, which comprises an 8 by 8 quantization matrix, from knowledge database 807 through an interface 811. If adaptive table selection module 803 cannot identify an appropriate quantization conversion table from adaptive control loop 251, module 803 selects a default quantization conversion table. A quantization conversion table may correspond to different data types that are dependent upon factors including the type of radar, processing platform (which may affect the number of bits associated with SAR data 202), and topography that is associated with SAR data 202.

Figure 9:
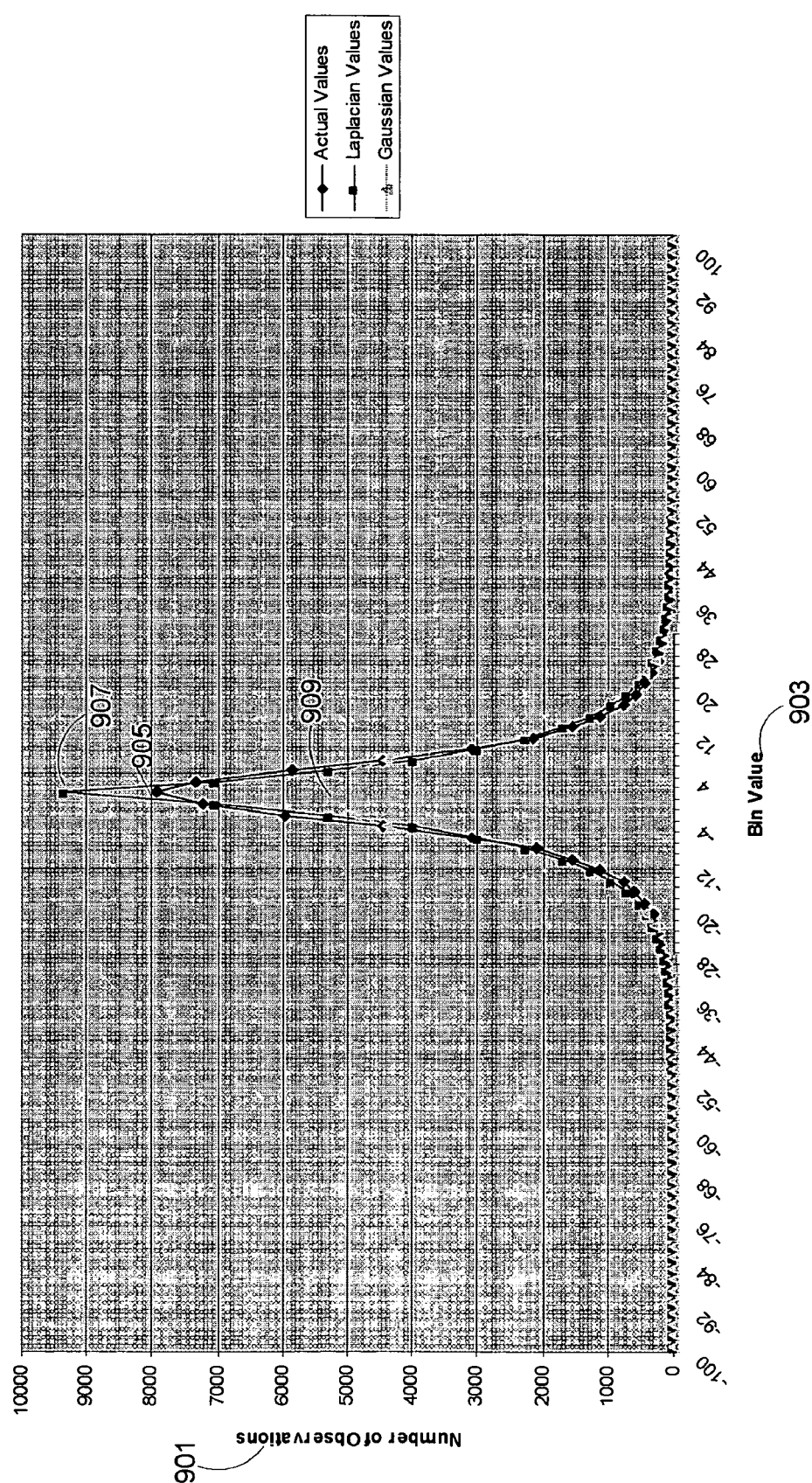
FIG. 9 shows a representative histogram for a low order Discrete Cosine Transform (DCT) coefficient in accordance with an embodiment of the invention.
Figure 10:
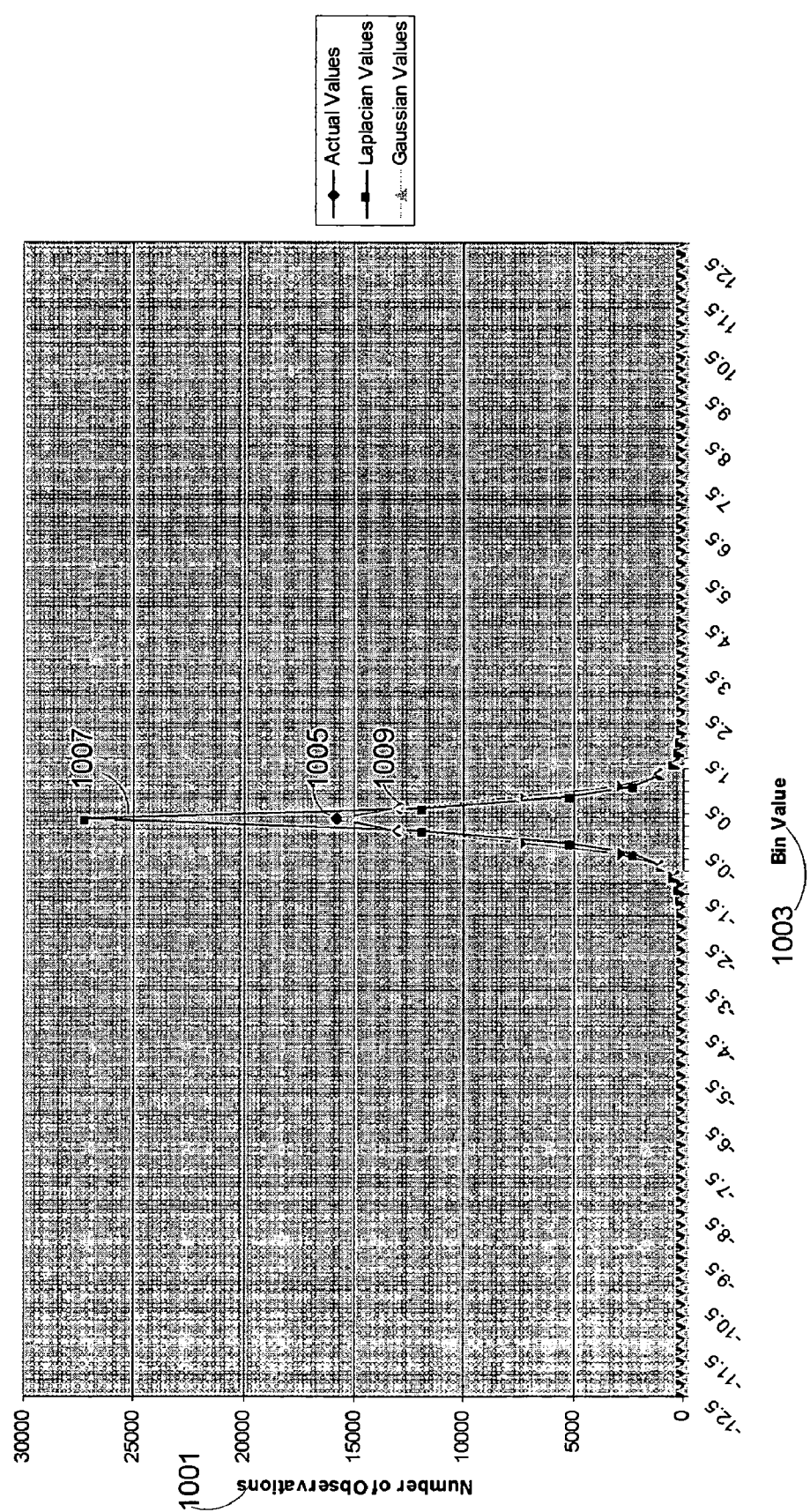
FIG. 10 shows a representative histogram for a high order Discrete Cosine Transform (DCT) coefficient in accordance with an embodiment of the invention.

Each element of a DCT matrix (e.g. matrix 703) is arithmetically divided by a corresponding element of the quantization matrix and rounded to an integer, thus providing quantized DCT data 208 (comprising a quantized I transform or a quantized Q transform). Each element of the quantization matrix is determined by statistics for the corresponding DCT coefficient in accordance with a specified maximum error (e.g. a root mean square error, a peak signal to noise ratio, and a byte by byte file comparison). (FIGS. 9 and 10 show statistics for the (1,1) and the (7,7) DCT coefficients, respectively.) The larger the value of an element of the quantization matrix, the greater the corresponding step size (with less resolution). However, dividing an element of the DCT matrix by a larger number reduces the quantized value. If the quantized value is sufficiently reduced, the resulting value may be considered as being zero by encoder 207 if a specified maximum error (e.g. the root mean square error) is satisfied.

In a variation of the embodiment, the quantization matrix may be determined by reducing a Measurement and Signature Intelligence (MASINT) product distortion. (In some cases, the reduction may correspond to a minimization of the distortion.) The distortion may be determined from interferometric SAR, coherent change detection (CCD), and polarimetry products. Interferometric SAR (IFSAR) is a comparison of two or more coherent SAR images collected at slightly different geometries. The process extracts phase differences caused by changes in elevation within the scene. IFSAR produces digital terrain elevation data suitable for use in providing terrain visualization products. (Products are generally referred as Digital Elevation Models (DEM).) These products are used in mapping and terrain visualization products. The advantage of IFSAR height determination is that is much more accurate than other methods, such as photo/radargrammetry methods that use only the intensity (magnitude) data, because phase is used and height determination is done with wavelength measurements which are very accurate (i.e. for commercial systems at C Band (5 GHz) approximately 5.3 cm)).

Coherent Change Detection (CCD) is a technique involving the collection and comparison of a registered pair of coherent SAR images from approximately the same geometry collected at two different times (before and after an event). The phase information, not the magnitude, is used to determine what has changed between the first and second collection. This can determine scene changes to the order of a wavelength (5.3 cm) and may denote ground changes/activity occurring between collections.

Polarimetry products are generally collected using systems that can independently radiate and collect vertical and horizontal complex SAR data. This technique is accomplished by alternately radiating vertical and horizontally polarized SAR pulses, receiving on both horizontal and vertical antennas, and saving the complex data from each. The product formed is a unique target signature for objects with an associated complex polarized radar reflectance. This technique is used in many automatic target recognition systems (ATR).

Figure 11:
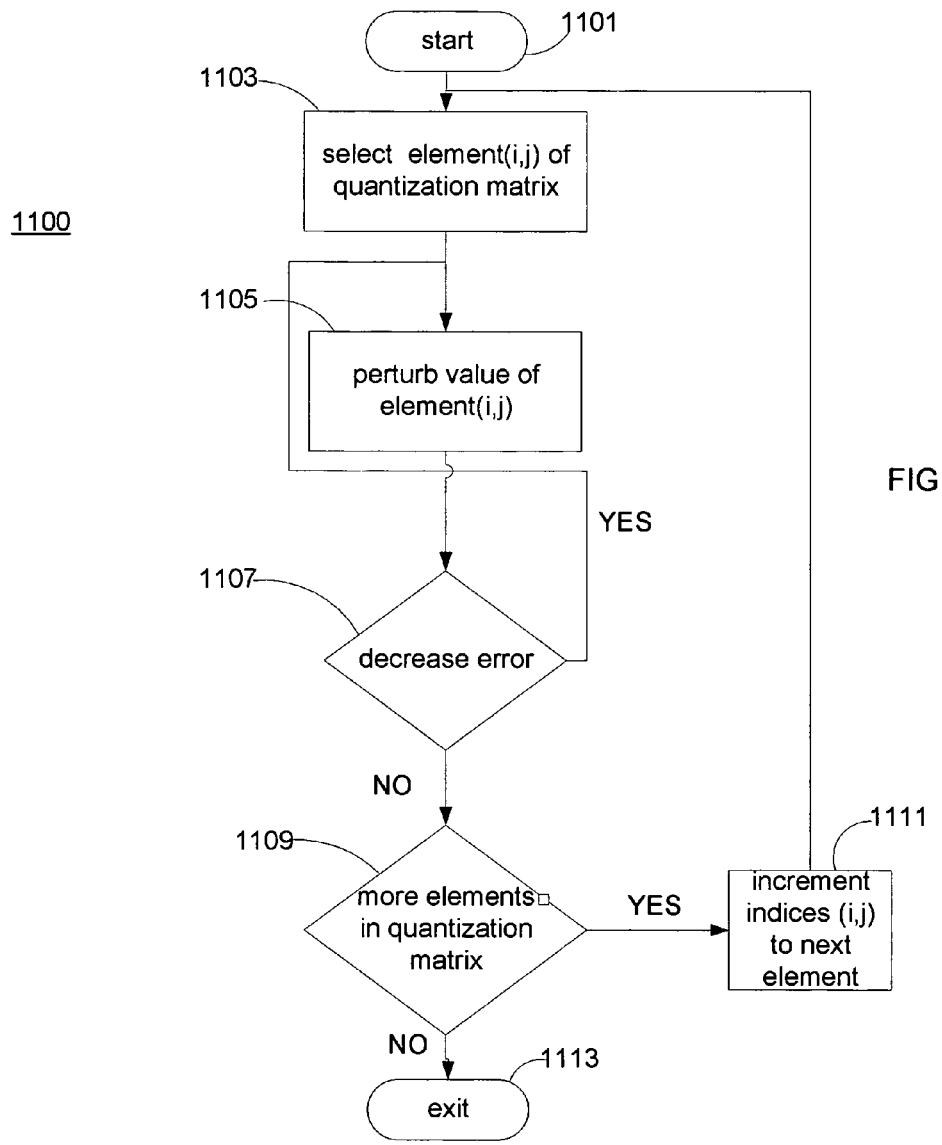
FIG. 11 shows a heuristic process for determining a quantization matrix according to an embodiment of the invention.

In a variation of the embodiment, each member of the quantization matrix (associated with a quantization conversion table) is determined by a heuristic process 1100 as shown in FIG. 11. A quantization matrix for SAR data 202 may be determined by selecting an element of the quantization matrix in step 1103 and perturbing the value of the selected element in step 1105. In step 1105, the selected element is incremented and decremented by incremental values. In step 1107, root means square errors (RSME) are calculated for different compression ratios. The selected value of the selected element is the value corresponding to a minimal root mean square error. If there are more elements in the quantization matrix to be processed, as determined in step 1109, the element indices (i,j) are incremented in step 1111, and the next element is selected in step 1103. Steps 1105 and 1107 are repeated for the next element. The calculation of the quantization matrix is completed after all the elements are processed.

In another variation of the embodiment, the quantization matrix is determined by the statistical characteristics of the DCT matrix, as was previously discussed. The quantization matrix is subsequently modified according to heuristic process 1100.

Transformed data 206 are quantized according to corresponding transform statistics that are associated with the DCT coefficients. DCT coefficients can be represented as departures from a standard statistical distribution function (e.g., Laplacian, Gaussian, or Rayleigh). (A Laplacian function has a form of $e^{-|x|}$, while a Gaussian function has a form of $e^{-x^2}$.) FIG. 9 shows a representative histogram for a low order Discrete Cosine Transform (DCT) coefficient, DCT coefficient (1,1), in accordance with an embodiment of the invention. A number of observations 901 is shown in relation to corresponding bin values 903. Actual data 905 is shown along with a Laplacian relation 907 and a Gaussian relation 909. Also, FIG. 10 shows a representative histogram for a high order Discrete Cosine Transform (DCT) coefficient, DCT coefficient (7,7), in accordance with an embodiment of the invention. A number of observations 1001 is shown in relation to corresponding bin values 1003. Actual data 1005 is shown along with a Laplacian relation 1007 and a Gaussian relation 1009. Analysis of the exemplary SAR data reveals a relationship with respect to the low order and high order DCT coefficients. By plotting the Laplacian and Gaussian functions and comparing the corresponding values with the DCT coefficient data of the exemplary SAR data, it is determined that low order terms can be better represented by the Laplacian function, and the higher order terms can be better represented by the Gaussian function for typical SAR data. Quantization by quantizer 205 is designed by accounting for the complex SAR image DCT statistics as exemplified by FIGS. 9 and 10. As the probability distribution becomes more focused about a zero value for a DCT coefficient, the less is the relative significance of the DCT coefficient with respect to other DCT coefficients. Consequently, the corresponding entry in the quantization conversion table may be greater for the DCT coefficient.

Other embodiments of the invention may utilize other transform types such as a Discrete Fourier Transform (DFT) or a discrete z-transform, both transforms being well known in the art. However, with a selection of a different transform, the transform statistics may be different as reflected by the design of quantizer 205.

Quantized SAR data 208 are consequently processed by encoder 207 (e.g. a Huffman encoder). Each output 210 (comprising a compressed I component and a compressed Q component) of encoder 207 comprises an encoder pair (comprising a number of zeros that precede output 210 and a number of bits that represent a value of the corresponding DCT coefficient) and the value of the corresponding DCT coefficient (SAR data 208). Encoder 207 may provide additional compression by removing a degree of redundancy that is associated with the encoder pair and SAR data 208 (in which frequently occurring data strings that are associated with the quantized DCT coefficients are replaced with shorter codes). Other embodiments of the invention may utilize other types of encoders such as Shannon Fano coding and Arithmetic coding. Encoder 207 provides encoded data 210 to post-processor 209.

Post-processor 209 may further process encoded data 210 in order to format data 210 into a format that is required for storing (that may be associated with archiving compressed data) or for transmitting compressed data 212 through a communications device. In the embodiment, the communications device may be a radio frequency transmitter that transmits from a plane to a monitoring station, utilizing a radio data protocol as is known in the art. In the embodiment, for example, post-processor 209 may format a data file (corresponding to a SAR image) into records that can be accommodated by a storage device. Also, post-processor may include statistical information and the data type regarding SAR data 202. The statistical information and the data type may be used for decompressing compressed SAR data 212 at a subsequent time.

Figure 12:
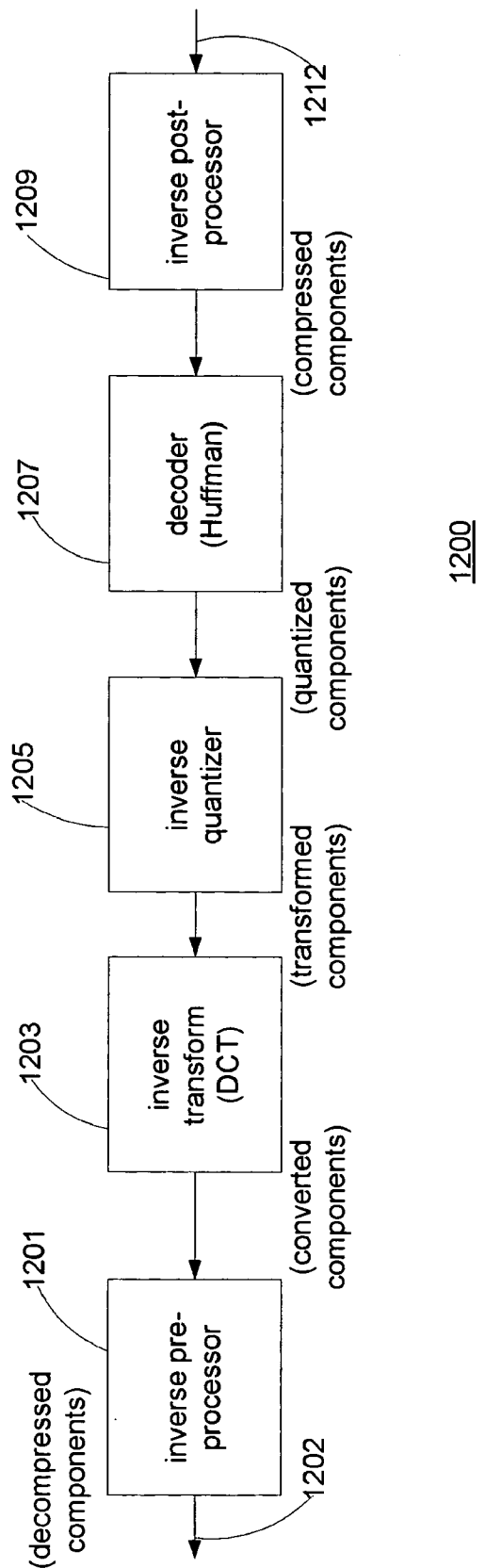
FIG. 12 shows an apparatus for decompressing data in accordance with an embodiment of the invention.

Compressed data 212 may be subsequently decompressed by using apparatus that utilizes inverse operations corresponding to the operations that are provided by apparatus 200 in a reverse order. FIG. 12 shows an apparatus 1200 for decompressing compressed data 1212 (that was compressed by apparatus 200 as shown in FIG. 2) into a decompressed data 1202 in accordance with an embodiment of the invention. (Decompressed data 1202 approximates data 202 within a specified maximum error.) An inverse post-processor 1209, a decoder 1107, an inverse quantizer 1205, an inverse transform module 1203, and an inverse preprocessor 1201 correspond to post-processor 209, encoder 207, quantizer 205, transform module 203, and preprocessor 201, respectively. However, an inverse operation may not be able to exactly recover data because of quantization restraints. For example, quantizer 203 divides a DCT coefficient by a corresponding element in the quantization matrix (which is obtained from a quantization conversion table selected by module 803 from knowledge database 807) and rounded to an integer. The operation of rounding to an integer may cause information about the DCT coefficient to be lost. Consequently, the lost information cannot be recovered by inverse quantizer 1205 in determining the DCT coefficient.

In the embodiment, compressed data 212 may be compliant with National Imagery Transmission Format (NITF) standards, in which header information about user-defined data (e.g. a quantization matrix) may be included. Thus, compressed data 212 may be compatible with processing software in accordance with Joint Photographic Experts Group (JPEG) compression standards.

Other embodiments of the invention may compress and decompress data that are characterized by a different number of components (often referred as dimensions). Data that is characterized by more than one component (e.g. 2, 3, or more components) are often referred as multidimensional data. In such cases, preprocessor 201 may determine statistical characteristics associated with each of the components and map each of the components to bins in accordance with the statistical characteristics. Transform module 203 transforms each of the components according to a selected transform (e.g. a Fast Fourier Transform). Quantizer 205 subsequently quantizes each of the transformed components.

Classical Electro-Optical (EO) based metrics, such as root mean square error (RMSE) and Peak Signal to Noise Ratio (PSNR), are useful for evaluating the magnitude imagery, but the EO-based metrics may not provide sufficient information about the phase data or the other derived products. EO-based metrics provide a necessary but not a sufficient condition for complex data compression fidelity. Useful magnitude imagery may also be available from the compression process. The processes that generate phase data driven products such as interferometry, CCD and polarimetry may be included in the evaluations. Additional SAR data product metrics may be implemented to evaluate the phase information and any degradation of the products caused by compression.

An evaluation of compressed exemplary SAR data as processed by apparatus 200 indicates that, with SAR data 202 being compressed at ratios greater than twenty to one, apparatus 200 may achieve near-lossless results for magnitude images and minimal degradation to phase information.

DETAILED DESCRIPTION OF THE INVENTION

Second-Generation Embodiments

Processing Interleaved Components

Figure 13:
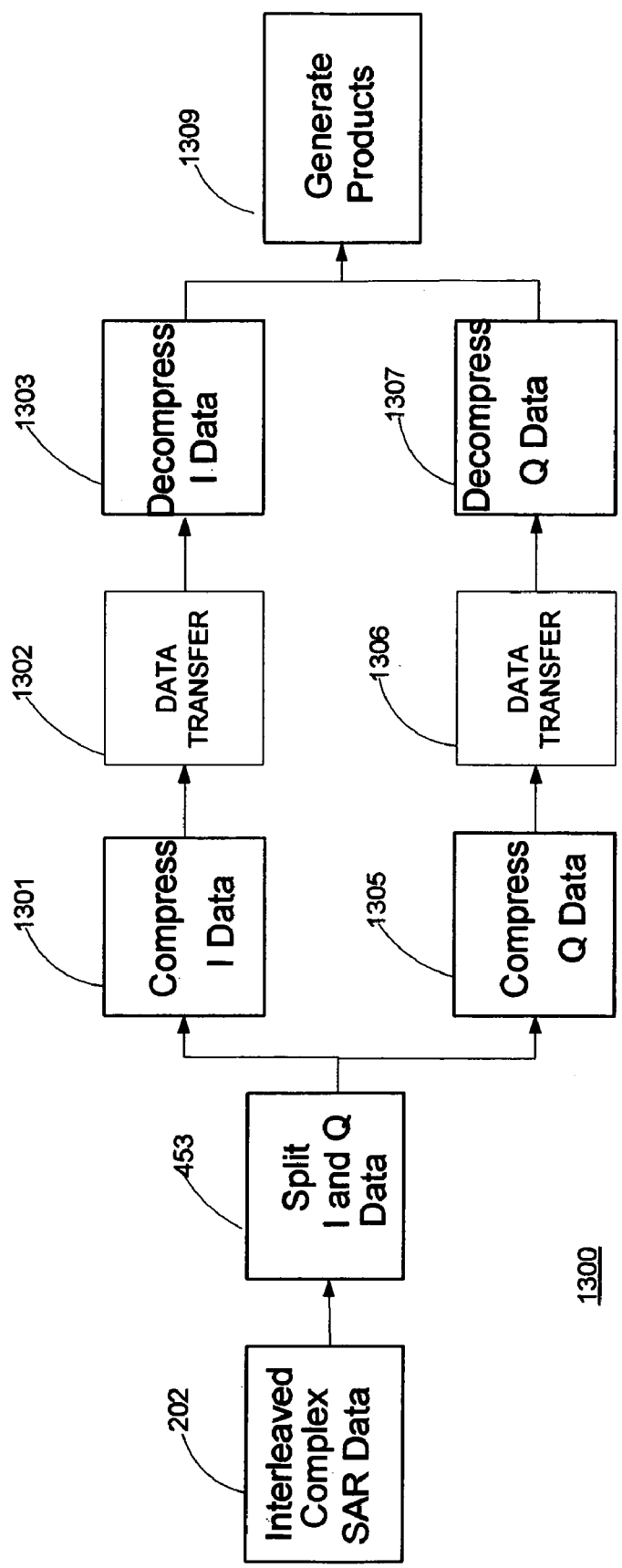
FIG. 13 shows an architecture for processing synthetic aperture radar data in which components are split in accordance with an embodiment of the invention.

FIG. 13 shows an architecture 1300 for processing synthetic aperture radar data 202 in which components are split in accordance with an embodiment of the invention. Data 202 comprises a received I component and a received Q component that are interleaved.

Figure 14:
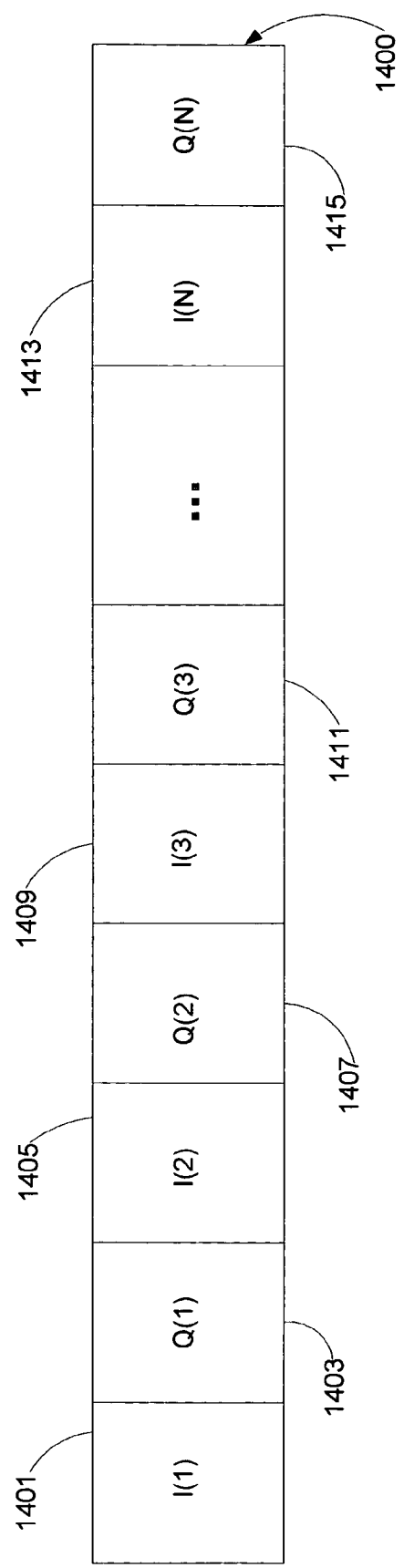
FIG. 14 shows a data stream comprising interleaved components in accordance with an embodiment of the invention.

FIG. 14 shows a data stream 1400 that transports complex SAR data 202. Data stream 1400 interleaves received I component samples (samples 1401, 1405, 1409, and 1413) with corresponding received Q component samples (samples 1403, 1407, 1411, and 1415).

Referring to FIG. 3, as previously discussed, adaptive source data calculations module 301 splits (separates) the received I component from the received Q component before further processing SAR data 202. With architecture 1300, the splitting of I and Q components is functionally associated with module 403 (as shown in FIG. 4A). As shown in architecture 1300, the I component and the Q component are separately processed for compressing and decompressing SAR data 202.

Figure 15:
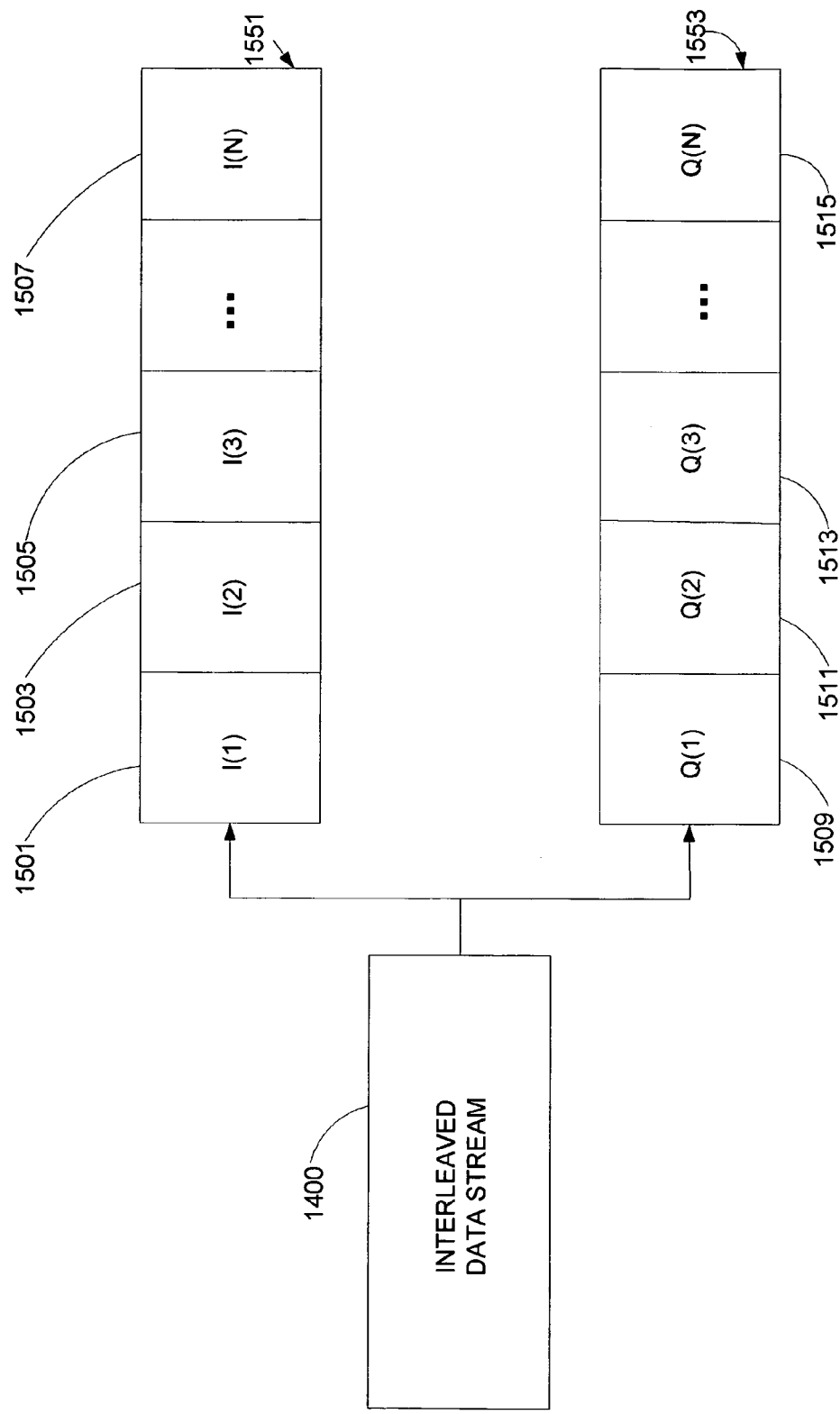
FIG. 15 shows splitting of interleaved components into constituent components in accordance with an embodiment of the invention.

FIG. 15 shows splitting data stream 1400 into I component 1551 and Q component 1553. I component 1551 comprises I component samples 1501, 1503, 1505, and 1507, and Q component 1553 comprises Q component samples 1509, 1511, 1513, and 1515.

Referring to FIG. 13, modules 1301 and 1303 process (compress and decompress) the I component, and modules 1305 and 1307 process the Q component. In the embodiment, I component data and Q component data are transferred by modules 1302 and 1306, respectively. (As examples, data may be transferred through file transfers, data tape transfers or radio transmission transfers.) The processed data is rendered by module 1309. Architecture 1300 is incorporated into the apparatus as previously discussed in FIG. 3.

Figure 16:
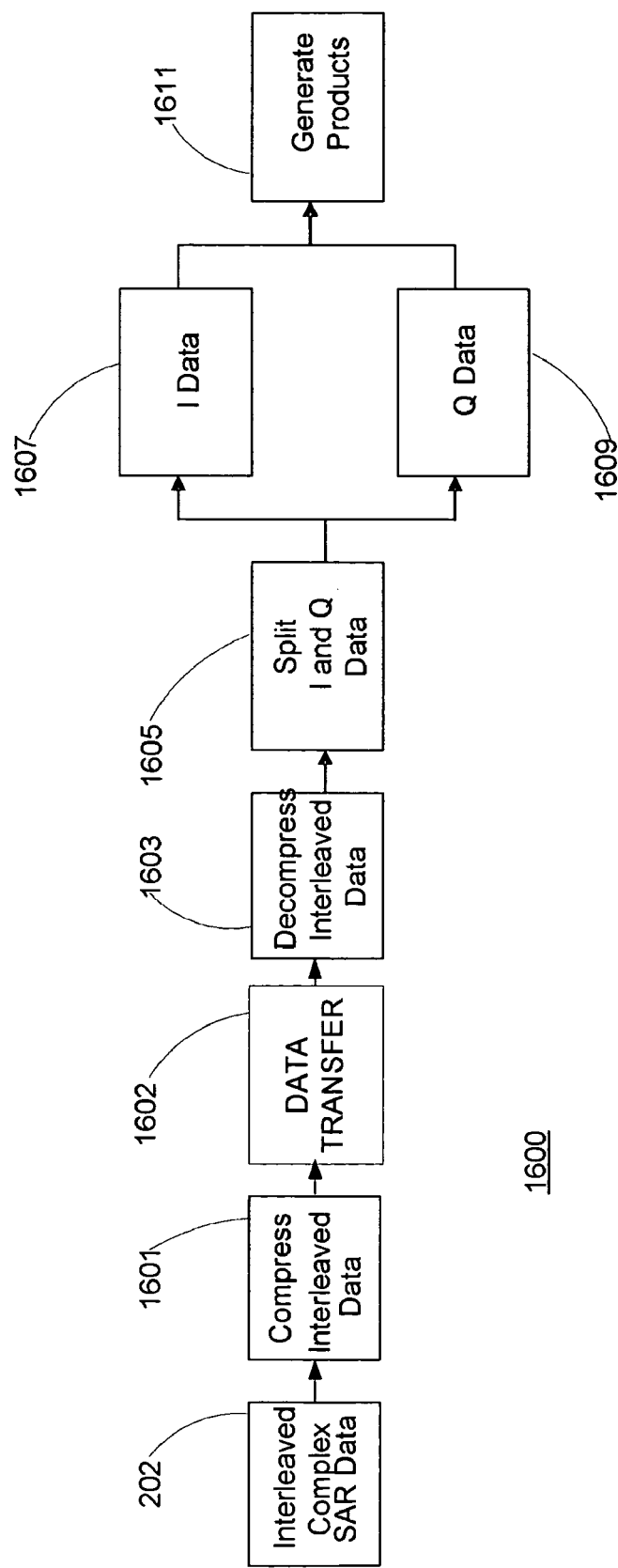
FIG. 16 shows an architecture for processing synthetic aperture data in which components are interleaved in accordance with an embodiment of the invention.

FIG. 16 illustrates a second architecture 1600 for processing synthetic aperture data 202 in which components are interleaved in accordance with an embodiment of the invention. With architecture 1600, interleaved I and Q component samples (for example as shown in FIG. 14) are processed by compress interleaved data module 1601 and decompress interleaved data module 1603. In the embodiment, interleaved data are transferred by module 1602. (As examples, interleaved data may be transferred through file transfers, data tape transfers or radio transmission transfers.) After processing by modules 1601 and 1603, I data 1607 is split from Q data 1609 by module 1605. Processed data (data 1607 and data 1609) is rendered by module 1611.

In the embodiment, modules 1601 and 1603 processes interleaved data, where the I component and the Q component have approximately the same statistical characteristics. Typically, the resulting compression ratio decreases the more that the statistical characteristics of the I component differ from those of the Q component.

Determination of Data Type

Figure 17:
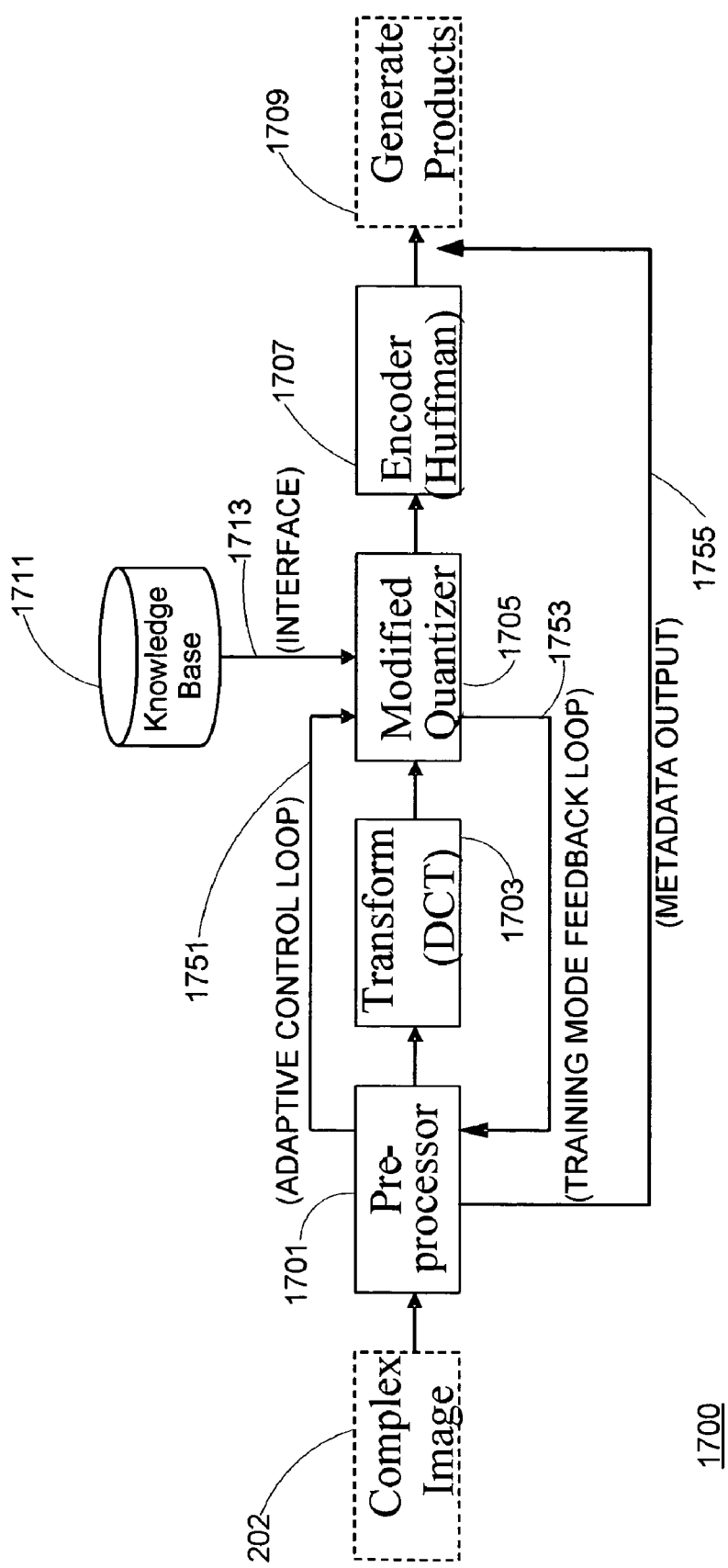
FIG. 17 shows a second apparatus for quantizing Discrete Cosine Transform (DCT) data in accordance with an embodiment of the invention.

FIG. 17 shows an apparatus 1700 that is a variation of apparatus 800 as shown in FIG. 8. As shown in FIG. 17, preprocessor 1701 corresponds to preprocessor 801, transform module 1703 corresponds to module 203, modified quantizer module 1705 corresponds to quantizer 205, encoder module 1707 corresponds to encoder 207, knowledge base 1711 corresponds to knowledge base 807, interface 1713 corresponds to interface 811, and adaptive control loop 1751 corresponds to adaptive control loop 251 in relation to FIG. 8. Apparatus 1700 also includes training mode feedback 1753 and metadata output 1755, which will be discussed.

As with adaptive control loop 251 as shown in FIG. 8, preprocessor 201 (as shown in FIG. 17) provides identification information about the data type for SAR data 202 to modified quantizer module 1705 through adaptive control loop 1751. In the embodiment, preprocessor 201 provides metadata, e.g., mean, standard deviation, maximum data value, and minimum data value, from which modified quantizer module 1705 can identify the data type and retrieve the appropriate quantization conversion table from knowledge base 1711.

If module 1705 cannot identify the data type from the metadata, module 1705 selects a default quantization table and uses the default quantization table from knowledge base 1711 as similarly explained in the context of FIG. 8. Moreover, modified quantizer module 1705 may notify preprocessor 1701, through training mode feedback loop 1753, that a data type cannot be identified using the provided metadata. Preprocessor 1701 may consequently specify a new quantization table corresponding to the metadata.

After quantizing the data, encoder module 1707 encodes the data, as previously explained with FIG. 8, and passes the processed data to module 1709. Additionally, preprocessor 1701 provides the metadata to module 1709 (through metadata output 1755) so that the processed data can be decompressed in accordance with the corresponding data type.

Figure 18:
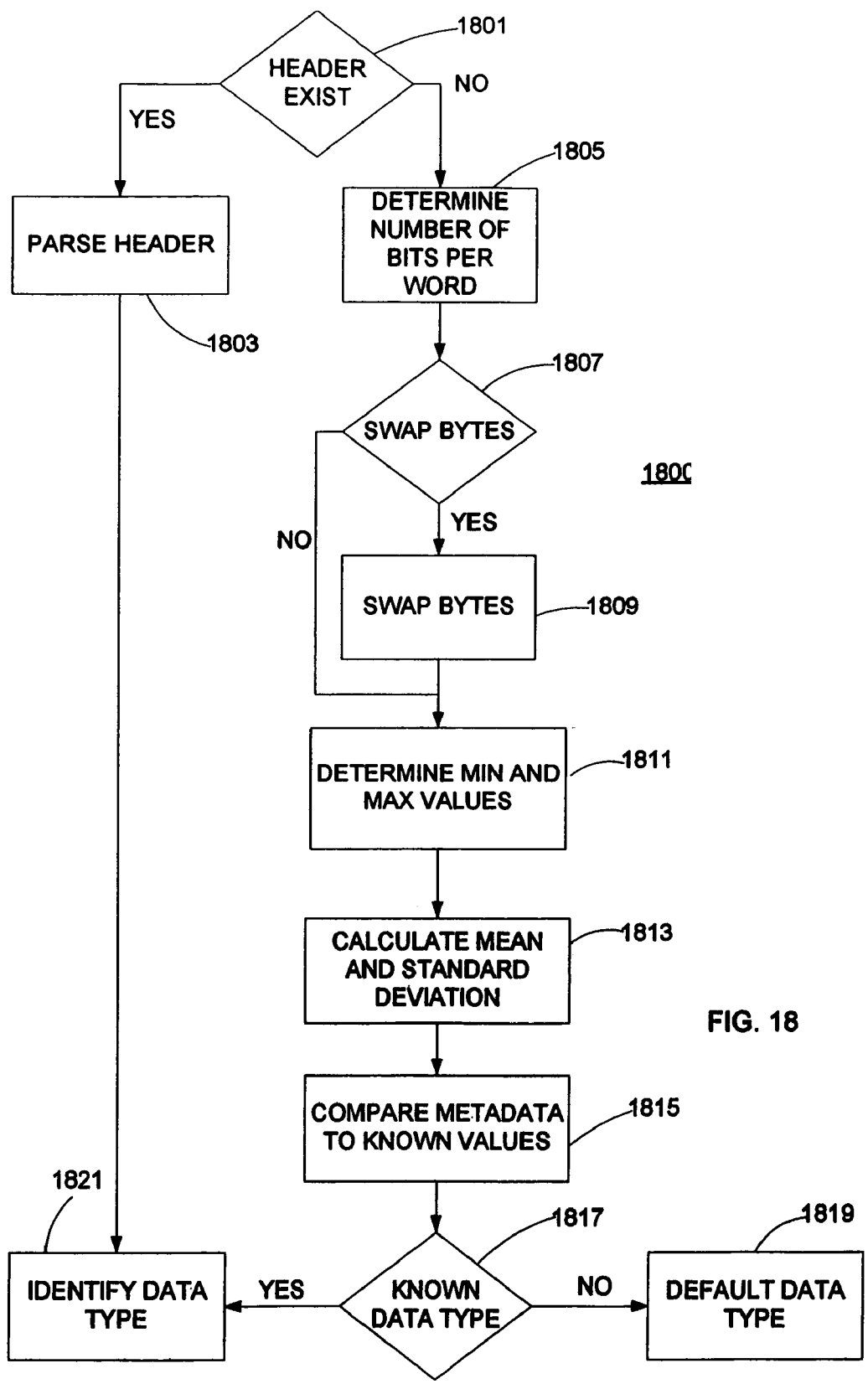
FIG. 18 shows a flow diagram for processing data header information to determine a data type in accordance with an embodiment of the invention.

FIG. 18 shows a flow diagram 1800 for determining the data type from SAR data 202 in accordance with an embodiment of the invention. In the embodiment, flow diagram 1800 is implemented with preprocessor 1701 and modified quantizer module 1705, although alternative embodiments may implement flow diagram 1800 entirely within module 1701 or module 1705 or another module or may implement flow diagram 1800 by distributing the functionality across a plurality of modules.

Step 1801 performs header analysis if header information is included with SAR data 202 by reading information at the beginning of a data file that identifies the format of the data being analyzed. (The operation of step 1801 is similar to the header analysis performed by adaptive source data calculations module 301 previously explained with FIG. 3.) Step 1803 parses the header information and the data type is identified in satep 1821.

If header data is not available, SAR data 202 is analyzed in order to deduce the metadata. In step 1805, the number of bits per data word is determined. If the order of bytes is reversed with respect to the assumed order that preprocessor 201 uses for processing SAR data 202, as determined by step 1807, the bytes are swapped in step 1809. (Operation of step 1807 and 1809 are similar to the operation as performed by preprocessor 201 as shown in FIG. 3.)

In step 1811, the maximum value and the minimum value of SAR data 202 are determined. Furthermore, the mean and the standard deviation of SAR data 202 are calculated in step 1813. The metadata (comprising the minimum value, the maximum data, the mean, and the standard deviation) are compared to corresponding metadata of known data types in step 1815. In step 1817, if the data type is known, the data type is identified in step 1821. Otherwise, the data type is assumed to be the default data type in step 1819.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

We claim:

1. A method for compressing received data comprising a first received component and a second received component, the method comprising:
    (a) receiving an interleaved stream of a first plurality of first received component samples with a second plurality of second received component samples;
    (b) converting the first received component to a first converted component in accordance with a statistical characteristic; and
    (c) converting the second received component to a second converted component in accordance with the statistical characteristic, wherein a resolution of at least one of the converted components is reduced with respect to a corresponding received component.

2. The method of claim 1, further comprising:
    (d) determining the statistical characteristic that is associated with the first received component and the second received component.

3. The method of claim 1, wherein (b) comprises mapping the first received component to a plurality of bins in accordance with the statistical characteristic in order to form the first converted component and (c) comprises mapping the second received component to the plurality of bins in accordance with the statistical characteristic in order to form the second converted component.

4. The method of claim 1, further comprising:
    (d) transforming the first converted component into a first transformed component and the second converted component into a second transformed component, wherein a first transformed plurality of first transformed component samples is interleaved with a second transformed plurality of second transformed component samples;
    (e) interleaving a first transformed plurality of first transformed component samples with a second transformed plurality of second transformed component samples;
    (f) quantizing the first transformed component into a first quantized transform and the second transformed component into a second quantized transform; and
    (g) interleaving a first quantized plurality of first quantized transform samples with a second quantized plurality of second quantized transform samples.

5. The method of claim 4, further comprising:
    (h) encoding the first quantized transform into a first compressed component and the second quantized transform into a second compressed component; and
    (i) interleaving a first compressed plurality of first compressed component samples with a second compressed plurality of second compressed component samples.

6. The method of claim 1, wherein the first received component corresponds to a received In-phase (I) component and the second received component corresponds to a received Quadrature (Q) component.

7. A computer-readable medium having computer executable instructions for performing the steps recited in claim 1.

8. An apparatus for compressing received data, the received data comprising a first received component and a second received component, the apparatus comprising:
    a preprocessor that converts the first received component to a first converted component and the second received component to a second converted component in accordance with a statistical characteristic of the received data and that interleaves a first plurality of first received component samples with a second plurality of second received component samples; and
    a transform module that transforms the first converted component into a first transformed component and the second converted component into a second transformed component and that interleaves a first transformed plurality of first transformed component samples with a second transformed plurality of second transformed component samples.

9. The apparatus of claim 8, further comprising:
    a quantizer that quantizes the first component into a first quantized transform and the second transformed component into a second quantized transform and interleaves a first quantized plurality of first quantized transform samples with a second quantized plurality of second quantized transform samples.

10. The apparatus of claim 9, further comprising:
    an encoder that encodes the first quantized transform into a first compressed component and the second quantized transform into a second compressed component and that interleaves a first compressed plurality of first compressed component samples with a second compressed plurality of second compressed component samples.

11. A method for decompressing data in order to approximate original data, the original data comprising a first original component and second original component, the method comprising:
    (a) receiving an interleaved stream of a first converted plurality of first converted component samples and a second converted plurality of second converted component samples;
    (b) obtaining a first converted component and a second converted component;
    (c) converting the first converted component to a first decompressed component in accordance with a statistical characteristic; and
    (d) converting the second converted component to a second decompressed component in accordance with the statistical characteristic, wherein at least one of the decompressed components comprises a greater number of bits than a corresponding converted component.

12. The method of claim 11, further comprising:
    (e) determining the statistical characteristic that is associated with the first original component and the second original component.

13. The method of claim 11, wherein (c) comprises mapping the first converted component to the first decompressed component from a plurality of bins in accordance with the statistical characteristic and (d) comprises mapping the second converted component to the second decompressed component from the plurality of bins in accordance with the statistical characteristic.

14. The method of claim 11, wherein the first original component corresponds to an original In-phase (I) component and the second original component corresponds to an original Quadrature (Q) component.

15. The method of claim 11, further comprising:
(e) splitting the first decompressed component from the second decompressed component.

16. The method of claim 11, wherein (a) comprises:
(i) obtaining a first quantized transform and a second quantized transform;
(ii) inverse quantizing the first quantized transform into a first transformed component and the second quantized transform into a second transformed component; and
(iii) inverse transforming the first transformed component into the first converted component and the second transformed component into the second converted component.

17. The method of claim 16, wherein (i) comprises:
(1) obtaining a first compressed component and a second compressed component; and
(2) decoding the first compressed component into the first quantized transform and the second compressed component into the second quantized transform.

18. A computer-readable medium having computer-executable instructions for performing the steps recited in claim 11.

19. A computer-readable medium having computer-executable instructions for performing the steps recited in claim 12.

20. An apparatus for decompressing data, the apparatus comprising:
a decompression module that obtains a first compressed component and a second compressed component, that converts the first compressed component to a first decompressed component and the second compressed component to a second decompressed component in accordance with a statistical characteristic of the data, and that interleaves a first plurality of first compressed component samples with a second plurality of second compressed component samples; and
a component separation module that splits the first decompressed component from the second decompressed component.

21. A method for quantizing a transformed first component and a transformed second component, the method comprising:
(a) selecting a quantization conversion table according to a data type associated with received data; and
(b) modifying the first transformed component into a first quantized transform and the second transformed component into a second quantized transform according to a corresponding entry of the quantization conversion table.

22. The method of claim 21, wherein (a) comprises:
(i) if the received data includes header information, parsing the header information to obtain the data type; and
(ii) if the received data does not include the header information, analyzing the received data to deduce metadata and utilizing the metadata to determine the data type.

23. The method of claim 22, wherein (ii) further comprises:
(1) if the metadata is not associated with a known data type, identifying the data type as a default data type.

24. The method of claim 22, wherein the metadata is selected from the group consisting of a mean, a standard deviation, a maximum value, and a minimum value of the received data.

25. An apparatus for compressing received data, the received data comprising a first received component and a second received component, the apparatus comprising:
a preprocessor that parses header information if a header is included with the received data and that deduces metadata from the received data if no header is included with the received data; and
a quantizer that obtains the metadata from the preprocessor and deduces a data type from the metadata, that selects a quantization conversion table corresponding to the data type, and that quantizes a first transformed component into a first quantized component and a second transformed component into a second quantized component by utilizing the quantization conversion table, wherein the first transformed component and the second transformed component are derived from the first received component and the second received component, respectively.

26. The apparatus of claim 25, further comprising:
a transform module that transforms a first converted component into the first transformed component and a second converted component into the second transformed component.

27. The apparatus of claim 26, wherein the preprocessor converts the first received component into the first converted component and the second received component into the second converted component in accordance with a statistical characteristic of the received data.

28. The apparatus of claim 26, wherein the preprocessor provides a metadata output that is combined with the first transformed component and the second transformed component.

29. The apparatus of claim 25, wherein the quantizer notifies the preprocessor whether a corresponding data type cannot be identified from the metadata.

* * * * *